United States Patent [19]
White et al.

[11] Patent Number: 5,459,432
[45] Date of Patent: Oct. 17, 1995

[54] USE OF A CHOPPER AND A SIGMA-DELTA MODULATOR FOR DOWNCONVERTING AND DIGITIZING AN ANALOG SIGNAL INCLUDING INFORMATION MODULATED BY A CARRIER

[75] Inventors: Stanley A. White, San Clemente; John C. Pinson, Anaheim, both of Calif.

[73] Assignee: Rockwell International Corporation, Seal Beach, Calif.

[21] Appl. No.: 376,467

[22] Filed: Jan. 20, 1995

Related U.S. Application Data

[60] Continuation of Ser. No. 224,463, Apr. 7, 1994, abandoned, which is a division of Ser. No. 95,781, Jul. 22, 1993, abandoned.

[51] Int. Cl.$^6$ .............................. H03D 1/24; H04L 27/22
[52] U.S. Cl. .......................... 329/307; 329/325; 329/341; 329/343; 329/356; 329/360; 331/27; 331/60; 375/321; 375/327; 375/328; 375/376
[58] Field of Search .................................. 329/302, 303, 329/306, 307, 323, 325, 326, 341, 342, 343, 346, 356, 358, 360, 361; 331/27, 60; 375/77, 80, 81, 82, 120

[56] References Cited

U.S. PATENT DOCUMENTS

| Re. 32,931 | 5/1989 | Staudte | 73/505 |
|---|---|---|---|
| 3,682,003 | 8/1972 | Sage et al. | 73/503 |
| 3,974,699 | 8/1976 | Morris et al. | 73/432 R |
| 4,190,801 | 2/1980 | DeFreitas al. | 325/38 B |
| 4,654,663 | 3/1987 | Alsenz et al. | 340/870.3 |
| 4,899,587 | 2/1990 | Staudte | 73/505 |
| 4,939,516 | 7/1990 | Early | 341/143 |
| 4,994,805 | 2/1991 | Dedic et al. | 341/143 |
| 5,056,366 | 10/1991 | Fersht et al. | 73/505 |
| 5,157,343 | 10/1992 | Voorman | 329/306 X |
| 5,179,380 | 1/1993 | White | 341/143 |
| 5,193,391 | 3/1993 | Cage | 73/505 |

FOREIGN PATENT DOCUMENTS 63-94718  4/1988  Japan .............................. H03M 3/04

OTHER PUBLICATIONS

Ferguson et al., "An 18b 20 KHz Dual ΣΔ A/D Converter," IEEE International Solid-State Circuits Conference, Digest of Technical Papers (1991), IEEE, New York, N.Y., pp. 68–69 and 292.

(List continued on next page.)

*Primary Examiner*—Siegfried H. Grimm
*Attorney, Agent, or Firm*—Tom Streeter; Charles T. Silberberg

[57] ABSTRACT

To demodulate an analog signal having information modulated by a carrier, the analog signal is chopped by a chopper, the chopped signal is digitized by a sigma-delta analog-to-digital converter to produce a series of digital samples at a sampling frequency, the digital samples are filtered in a digital decimating filter to produce data words, and the data words are modulated by an intermediate frequency signal to produce a detected information signal. The various frequency signals are generated by a phase-lock loop so that the intermediate frequency is the difference between the carrier frequency and the chopping frequency, and both the chopping frequency and the intermediate frequency are sub-multiples of the sampling frequency. Therefore aliases and artifacts caused by the chopper are either cancelled or fall on multiples of the output sampling frequency, and the intermediate frequency signal can be a square wave without generating artifacts that need be removed by filtering of the detected information signal. Preferably the chopper is placed in an analog portion of a feedback loop of the sigma-delta modulator, and an exclusive-OR gate is placed in the digital portion of the feedback loop, so that the gain of the demodulation process becomes independent of the gain of the chopper. The detection process is especially suited for detecting an angular-rate signal from a vibrating quartz angular rate sensor, because the detection process has very high accuracy, resolution, and linearity.

26 Claims, 23 Drawing Sheets

OTHER PUBLICATIONS

Boser and Wooley, "The Design of Sigma–Delta Modulation Analog–to–Digital Converters," IEEE J. of Solid–State Circuits, vol. 23, No. 6 (Dec. 1988), IEEE, New York, N.Y., pp. 1298–1308.

Chi–Tsong Chen, *One–Dimensional Digital Signal Processing*, Marcel Dekker, Inc., New York, N.Y. (1979), pp. 206–215.

Rabiner and Gold, *Theory and Application of Digital Signal Processing*, Prentice–Hall, Inc., Englewood Cliffs, N.J. (1975), pp. 136–140, 194–204.

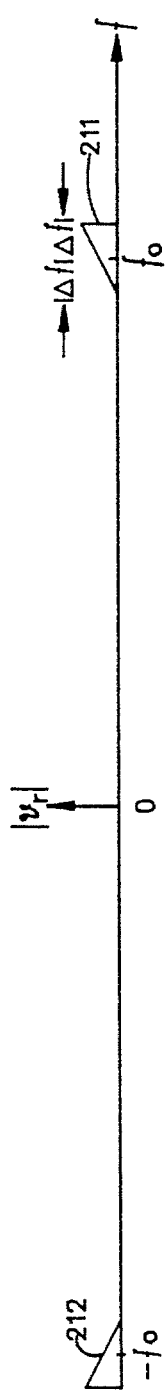
FIG. 21A
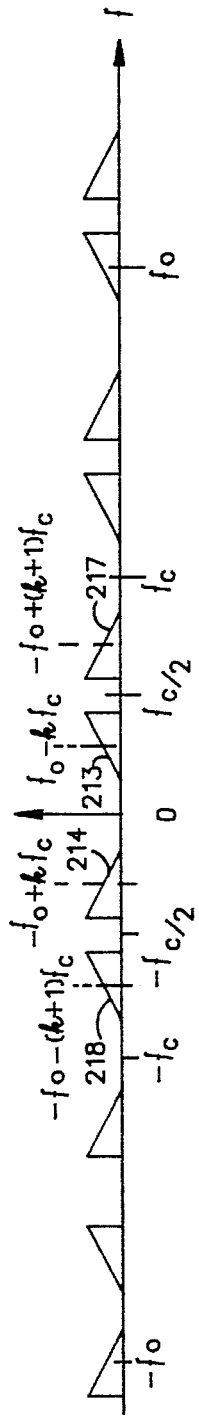
FIG. 21B  CASE 1: NONINVERTED SPECTRA
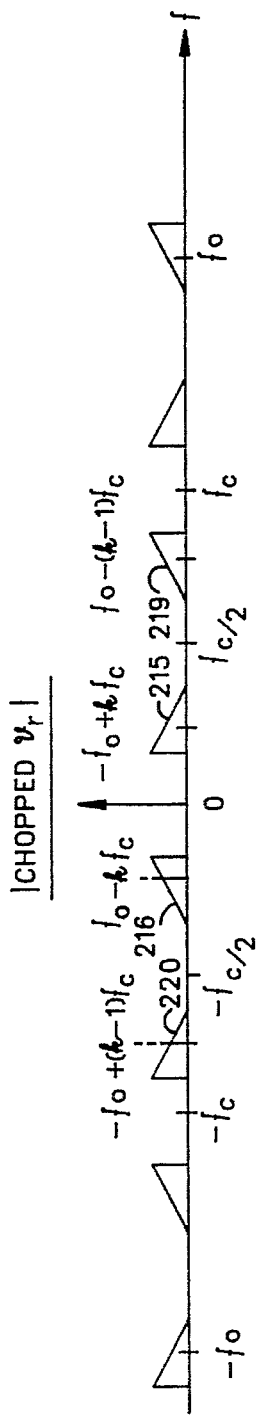
FIG. 21C  CASE 2: INVERTED SPECTRA FIG. 25   11 BIT DIGITAL WORDS AT 303.03 Hz RATE BAND-LIMITED TO ABOUT 50 Hz

USE OF A CHOPPER AND A SIGMA-DELTA MODULATOR FOR DOWNCONVERTING AND DIGITIZING AN ANALOG SIGNAL INCLUDING INFORMATION MODULATED BY A CARRIER

This is a continuation application of application Ser. No. 08/224,463, filed on Apr. 7, 1994, which is a divisional application of application Ser. No. 08/095,781 filed on Jul. 22, 1993, both of which are now abandoned.

BACKGROUND OF THE INVENTION

1. Field of the Invention

The present invention relates generally to digital signal processing, and more particularly to signal processing for a quartz angular-rate sensor or solid-state gyroscope.

2. Backqround Art

Angular-rate sensors are essential components of navigational and inertial guidance systems of aircraft, spacecraft, ships, and missiles. Traditionally, mechanical gyroscopes were used for angular rate sensing. More recently, laser ring gyros and vibrating quartz gyros have been developed that have characteristics superior to mechanical gyroscopes.

A particularly economical vibrating quartz gyro is made by acid etching of a quartz wafer and has two pairs of parallel tines in an "H" configuration. Such a quartz gyro is described, for example, in Fersht et al. U.S. Pat. No. 5,056,366 and Staudte U.S. Patent Re 32,931. One pair of tines (the drive tines) is driven by an oscillator so that the tines move toward each other and away from each other. Rotational motion of the tines about the central longitudinal axis of the "H" causes the vibration of the drive tines to couple, by coriolis force, to the other pair of tines (the pick-off tines). The coriolis force causes the pick-up tines to vibrate in such a way that when one pick-off tine moves in one traverse direction perpendicular to the plane of the "H", the other pick-off tine moves in the opposite transverse direction perpendicular to the plane of the "H". The force, which drives the pick-off tines, is proportional to the cross-product of the angular rate of rotation $\Omega$ (e.g., radians per second), and the linear velocity of the drive tines (e.g., meters per second). Metal film pads are plated onto the tines for piezoelectric coupling to these vibrations of the tines. In the electrical pick-off signal, the angular rate of rotation of the quartz gyro about the longitudinal axis appears as double-sideband suppressed-carrier (DSSC) modulation of input angular rate; the carrier frequency is the frequency of oscillation of the drive tines. Therefore, an angular-rate signal can be recovered from the pick-off signal by a synchronous demodulator.

Analog circuits have been used for exciting the quartz gyro and for synchronous demodulation of the pick-off signal. Analog circuits, however, are subject to voltage offsets and drift of component values due to temperature variations and aging. These problems are particularly troublesome due to peculiarities of the quartz gyro that are not apparent from the simplified or "first order" operating characteristics as described above. One problem is related to the resonant frequencies of the drive tines and the pick-off tines. It is undesirable for the pick-off tines to have the same resonant frequency as the drive tines because of the extreme difficulty of removing the dynamics of the pick-off tines from the pick-off signal. If the pick-off tines did have the same resonant frequency as the drive tines, then a maximum amplitude response would be obtained from the pick-off tines, but the angular-rate signal would be a very non-linear function of the angular rate. The resonant frequency of the pick-off tines, however, must be tuned relatively closely to the resonant frequency of the drive tines, or else the dynamic range of the angular-rate signal is limited by noise. Therefore, some resonant frequency offset is required between the drive tines and the pick-off tines. This compromise in resonant frequency offset is to an extent dependent on the bandwidth of the angular-rate signal. In particular, the pick-off tines have a two-pole resonance characteristic, giving a second-order response ($\approx 1/(\omega^2-\omega_o^2)$) far away from the resonant frequency ($\omega_o$). In practice, these considerations dictate that the difference between the resonant frequency of the drive tines and the resonant frequency of the pick-off tines should be about twice the bandwidth of the angular rate to be sensed by the quartz gyro. A typical quartz gyro for inertial navigation applications, for example, has a drive resonant frequency of about 10 kilohertz, a Q of about 18,000, and a difference of about 100 Hz between the drive resonant frequency and the pick-off resonant frequency. The pick-up tines, for example, have the higher resonant frequency. This difference in resonant frequencies causes the amplitude of the angular-rate signal to be dependent on the frequency as well as the amplitude of vibration of the drive tines. Moreover, the temperature dependence of the difference between the drive and pick-off resonant frequencies is the most critical temperature dependent parameter of the quartz gyro.

To obtain sufficient performance for inertial navigation, the analog circuits associated with the quartz gyro have been relatively complex and expensive. Moreover, it is estimated that the limitations of the prior-art analog circuitry causes the performance of the quartz gyro to be about an order of magnitude less than that theoretically possible and attainable by sufficiently complex digital signal processing.

SUMMARY OF THE INVENTION

In accordance with a basic aspect of the invention, there is provided a method of using a chopper in connection with a sigma-delta modulator for demodulating an analog signal including information modulated by a carrier signal. The chopper and the delta-sigma modulator can be constructed of low-cost components, yet the demodulation and analog-to-digital conversion can be performed with very high accuracy, resolution, and linearity. The chopper, for example, includes analog switches such as field-effect transistors that switch the polarity of the analog signal in response to a chopping signal. The analog signal, for example, is a double-sideband suppressed-carrier (DSSC) signal received from the pick-up tines of a quartz rate sensor, and the DSSC signal is demodulated to recover an angular-rate signal. The analog signal is demodulated by: a) generating a sampling signal having a sampling frequency $f_s$, a chopping signal having a chopping frequency $f_c$, and an intermediate frequency signal at an intermediate frequency $f_d$ that is the magnitude of the difference between the carrier frequency $f_o$ and a harmonic of the chopping frequency $f_c$, the frequencies being related by predetermined integers $I_1$, $I_2$, $I_3$, and $I_4$ such that $f_o=(I_3/I_4)f_s$, $f_c=f_s/I_1$, and $f_d=f_s/I_2$; b) chopping the analog signal with the chopping signal to produce a chopped analog signal; c) digitizing the chopped analog signal with a sigma-delta modulator including an analog-to-digital converter clocked by the sampling signal and receiving the chopped analog signal to produce digital samples at the sampling frequency; d) filtering the digital samples in a digital filter to produce data words; and e)

demodulating the data words by the intermediate frequency signal to produce a detected information signal. This method insures that aliases and artifacts caused by the chopper, such as feed-through and imbalance in the chopper, are either cancelled or fall on integer multiples of the output sampling frequency. Moreover, the intermediate frequency signal can be a square wave, and the use of a square wave for the intermediate frequency signal does not generate artifacts that need be removed by filtering of the detected information signal. The various frequencies are conveniently generated by phase-locking a high-frequency oscillator to the carrier frequency, and clocking a set of digital counters in response to the high-frequency oscillator.

In accordance with another aspect of the invention, the chopper is disposed in an analog portion of a feedback loop of the sigma-delta modulator, and the sigma-delta modulator includes an exclusive-OR gate responsive to the chopping signal and disposed in a digital portion of the feedback loop. The gain of the demodulation process therefore becomes substantially independent of the gain of the chopper. The analog signal is chopped and digitized by the method of: a) summing the analog signal with an analog feedback signal to produce an error signal; b) chopping the error signal in response to a chopping signal to produce a chopped signal; c) low-pass filtering the chopped signal to produce a filtered signal; d) converting the filtered signal to a series of binary samples at a periodic sampling rate; e) producing a digital feedback signal that is an exclusive-OR function of the chopping signal and the series of binary samples; and f) producing the analog feedback signal by digital-to-analog conversion of the digital feedback signal.

In a preferred embodiment, the series of binary samples from the sigma-delta modulator are filtered in a finite impulse response (FIR) digital decimation filter that has a cutoff frequency greater than the intermediate frequency plus the bandwidth of the information modulated by the suppressed carrier. The chopping frequency is a harmonic of the word rate of the digital decimation filter. Preferably the digital decimation filter provides digital words at a word rate that is four times the intermediate frequency. In this case, the information modulated by the suppressed carrier can be very easily detected from the digital words by a complex demodulator using square-wave in-phase and quadrature-phase reference signals at the intermediate frequency. Then the square waves modulate the digital words by selectively complementing them, in order to produce in-phase and quadrature-phase detected information signals. Moreover, the information modulated by the suppressed carrier can be very easily digitally filtered from the detected information signals when the intermediate frequency is at least about six times the bandwidth of the information modulated by the suppressed carrier.

BRIEF DESCRIPTION OF THE DRAWINGS

Other objects and advantages of the present invention will become apparent upon reading the following detailed description and upon reference to the drawings, in which:

FIG. 21A is a graph showing a spectrum of an analog double-sideband suppressed-carrier (DSSC) signal about a frequency FIG. 21B is a graph of a spectrum obtained by down-converting the spectrum of FIG. 21A in which the baseband spectrum is not inverted with respect to the spectrum of the DSSC signal;

FIG. 21C is a graph of a spectrum obtained by down-converting the spectrum of FIG. 21A in which the baseband spectrum is inverted with respect to the spectrum of the DSSC signal;

While the invention will be described in connection with certain preferred embodiments, it is not intended that the invention should be limited to these particular embodiments. On the contrary, the invention is intended to include all modifications, alternatives, and equivalent arrangements as may be included within the spirit and scope of this invention as defined by the appended claims.

DETAILED DESCRIPTION OF THE PREFERRED EMBODIMENTS

Figure 1:
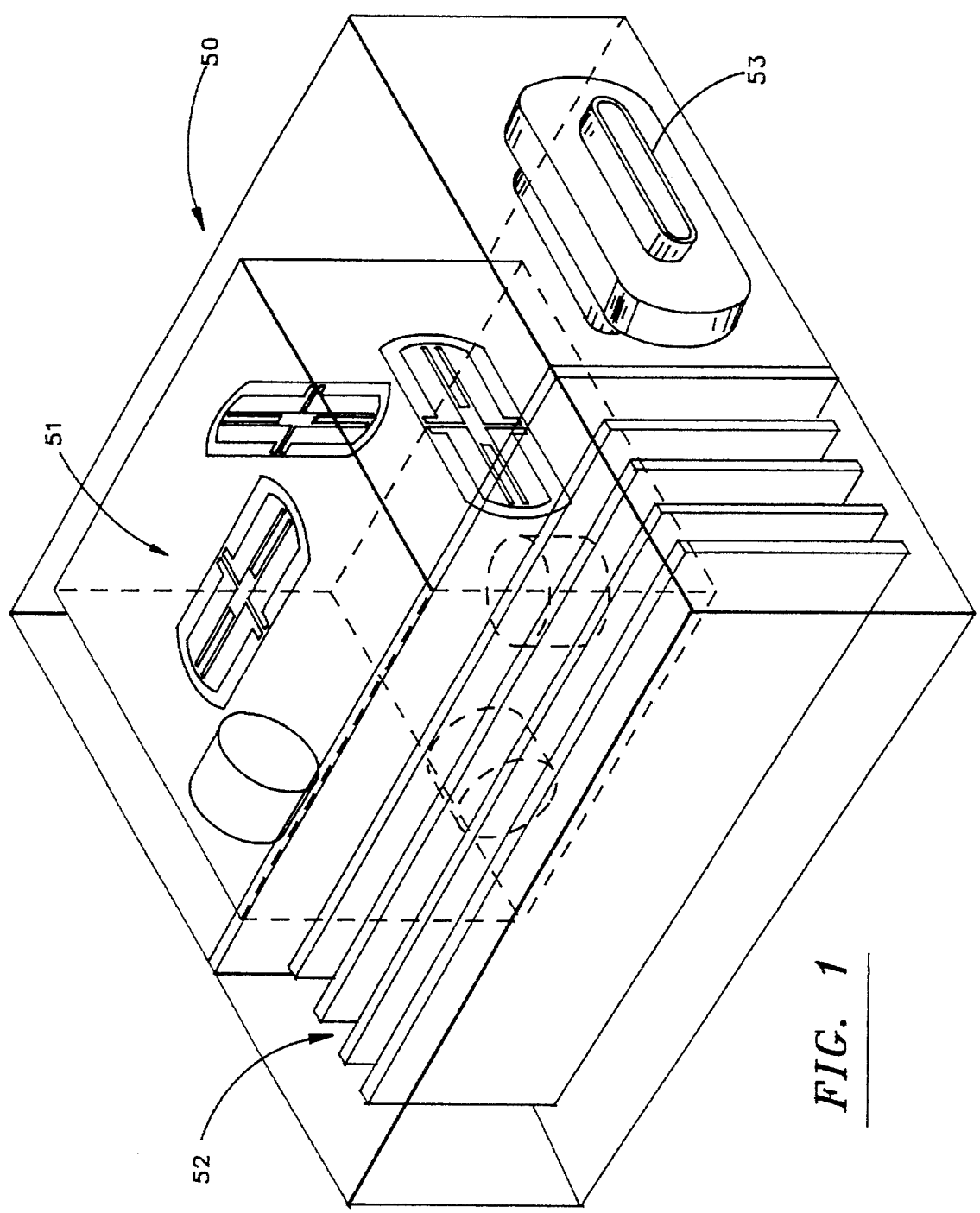
FIG. 1 is a perspective view of an inertial measurement unit incorporating the present invention.

Turning now to the drawings, there is shown in FIG. 1 a schematic perspective view of an inertial measurement unit generally designated 50 incorporating the present invention. The inertial measurement unit includes a block of sensors 51, electronic circuit boards 52, and an electrical connector 53. The inertial measurement unit 50 provides an angular velocity signal and a linear acceleration signal with respect to each of three orthogonal directions. The angular velocity and linear acceleration signals have a 50 Hz bandwidth.

Figure 2:
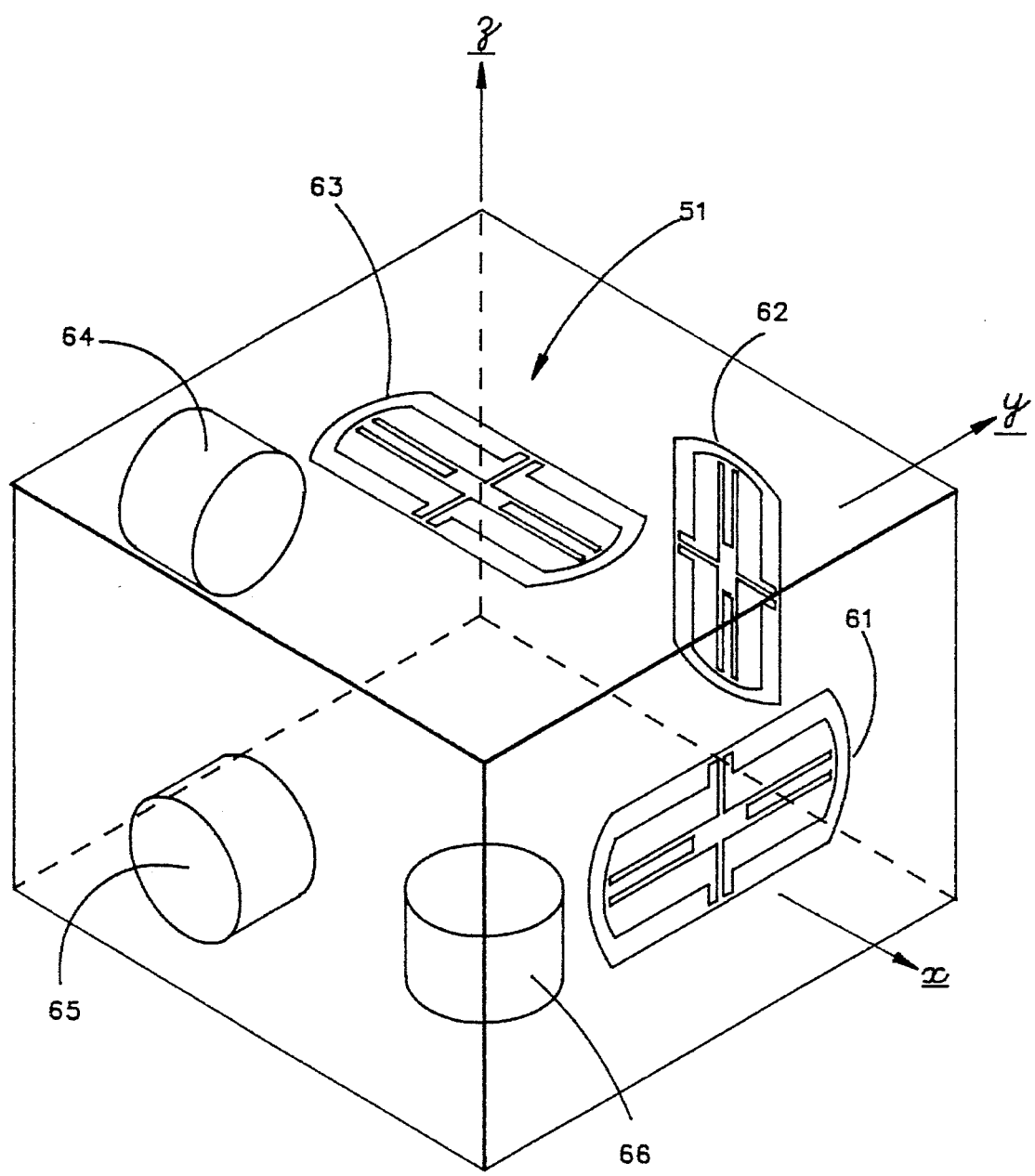
FIG. 2 is a pictorial view of a mounting arrangement for accelerometers and quartz angular-rate sensors used in the inertial measurement unit of FIG. 1.

Turning now to FIG. 2, there is shown a pictorial view of the sensor block 51. The block is made of a rigid material such as aluminum or polycarbonate. A quartz angular-rate sensor or a vibrating quartz accelerometer is mounted into each of the six faces of the block 51. The sensors include quartz angular-rate sensors 61, 62, and 63 mounted on the faces facing the +x, +y, and +z directions. The sensors include vibrating quartz accelerometers 64, 65, and 66 mounted on the faces facing the -x, -y, and -z directions, respectively.

The present invention concerns signal processing for the quartz angular-rate sensors 61, 62, and 63. The quartz angular-rate sensors operate entirely independent of the vibrating quartz accelerometers. Therefore, the vibrating quartz accelerometers 64, 65, 66 are not pertinent to the present invention and will not be described in any further detail.

Figure 3:
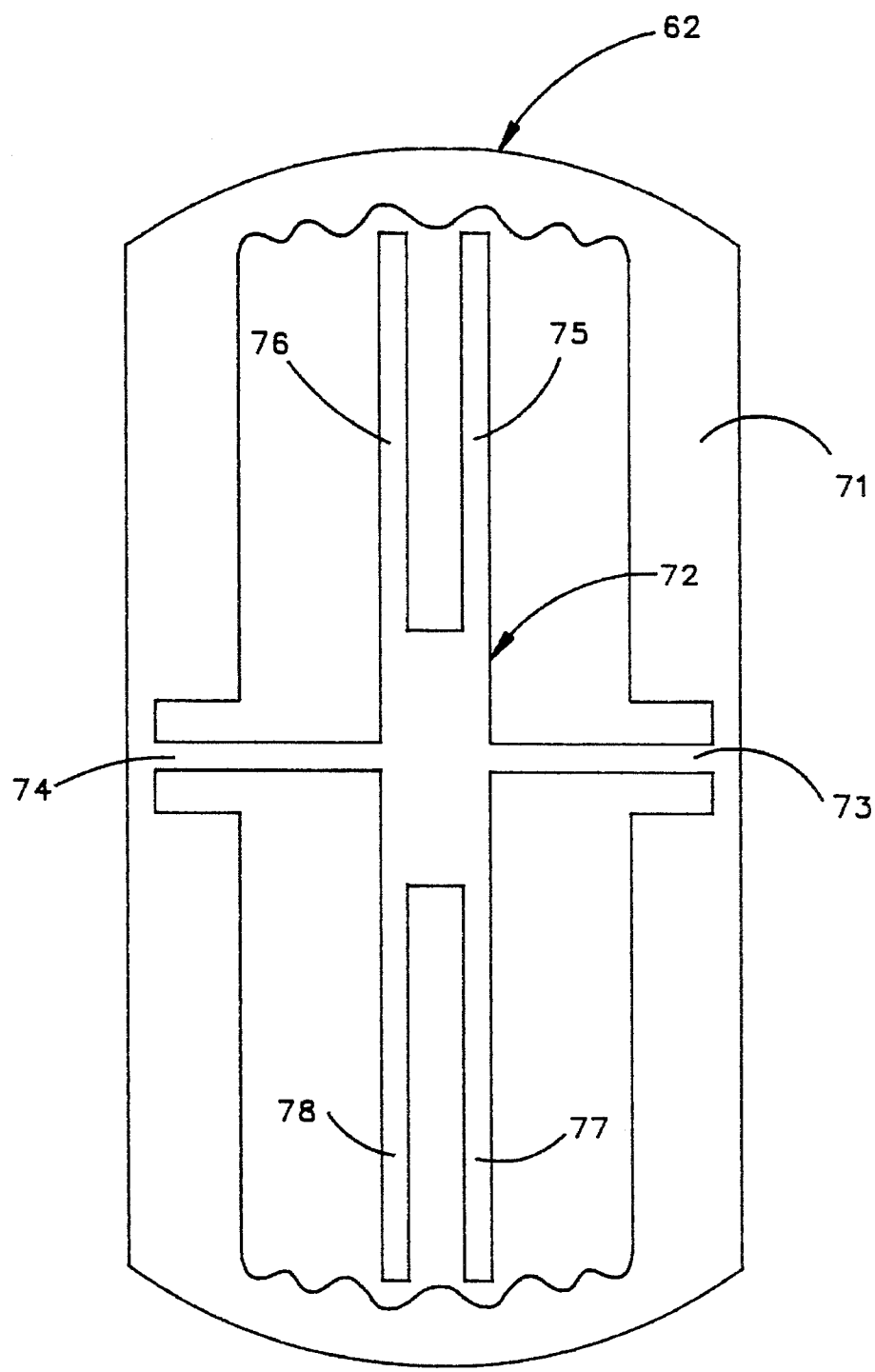
FIG. 3 is a plan view of one of the quartz angular-rate sensors of FIG. 2.

Turning now to FIG. 3, there is shown a more detailed view of the quartz angular-rate sensor 62. The sensor 62 is fabricated from a z-cut quartz wafer using conventional photolithographic and acid etch batch processes, and can be purchased from Systron Donner Corporation of Concord, California. The sensor has a frame 71 attached to an "H"-shaped section by a pair of bridges 73, 74. The "H"-shaped section 72 has a pair of drive tines 75, 76, and a pair of pick-up tines 77, 78.

Figure 4:
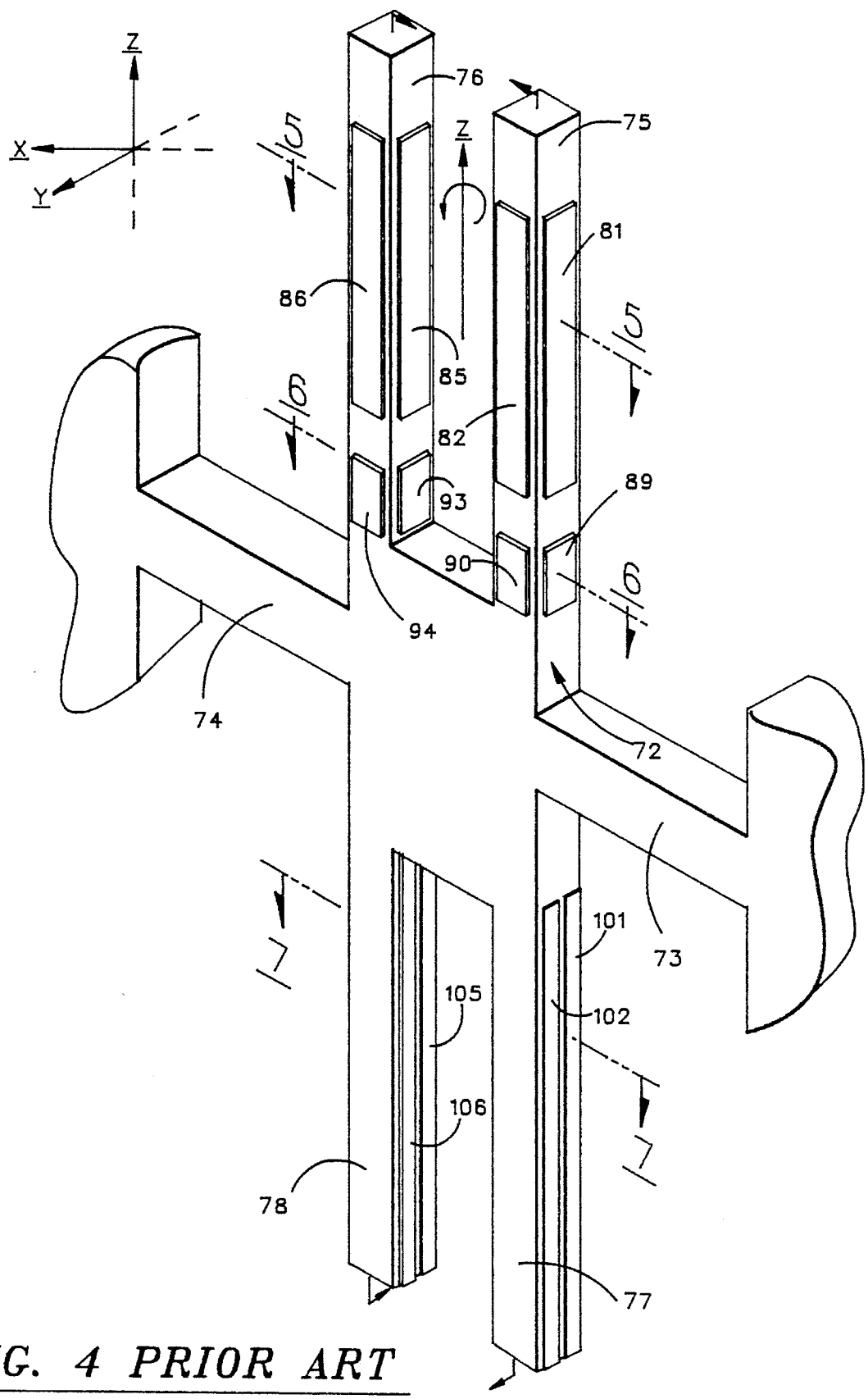
FIG. 4 is a perspective view of a central portion of the quartz angular-rate sensor of FIG. 3.
Figure 5:
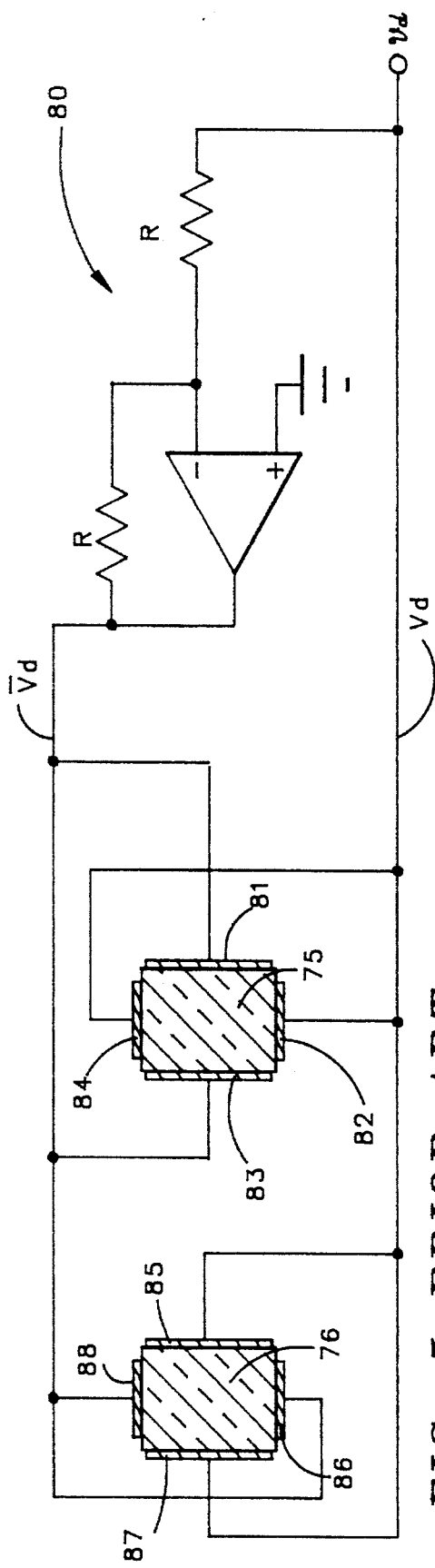
FIG. 5 is a cross-section of drive tines of the quartz angular-rate sensor of FIG. 4 along section line 5—5 in FIG. 4.

Turning now to FIG. 4, there is shown a number of metal film electrodes deposited on the tines 75, 76, 77, and 78. The drive tines 75, 76 are provided with drive electrodes 81, 82, 83, 84, 85, 86, 87, 88, as further shown in FIG. 5. The drive electrodes are driven by a complementary drive signal $V_d$, as shown in FIG. 5, to excite a mode of vibration in the drive tines 75, 76 in which the drive tines first move toward each other in the x direction, as shown in FIG. 4, and then away from each other, during each cycle of vibration. To sustain such a mode of vibration, the complementary drive signal $V_d$ must be tuned to the resonant frequency of the drive tines. As shown in FIG. 5, a unity-gain inverting amplifier 80 is used in providing the complementary drive signal from a single-ended drive signal.

Figure 6:
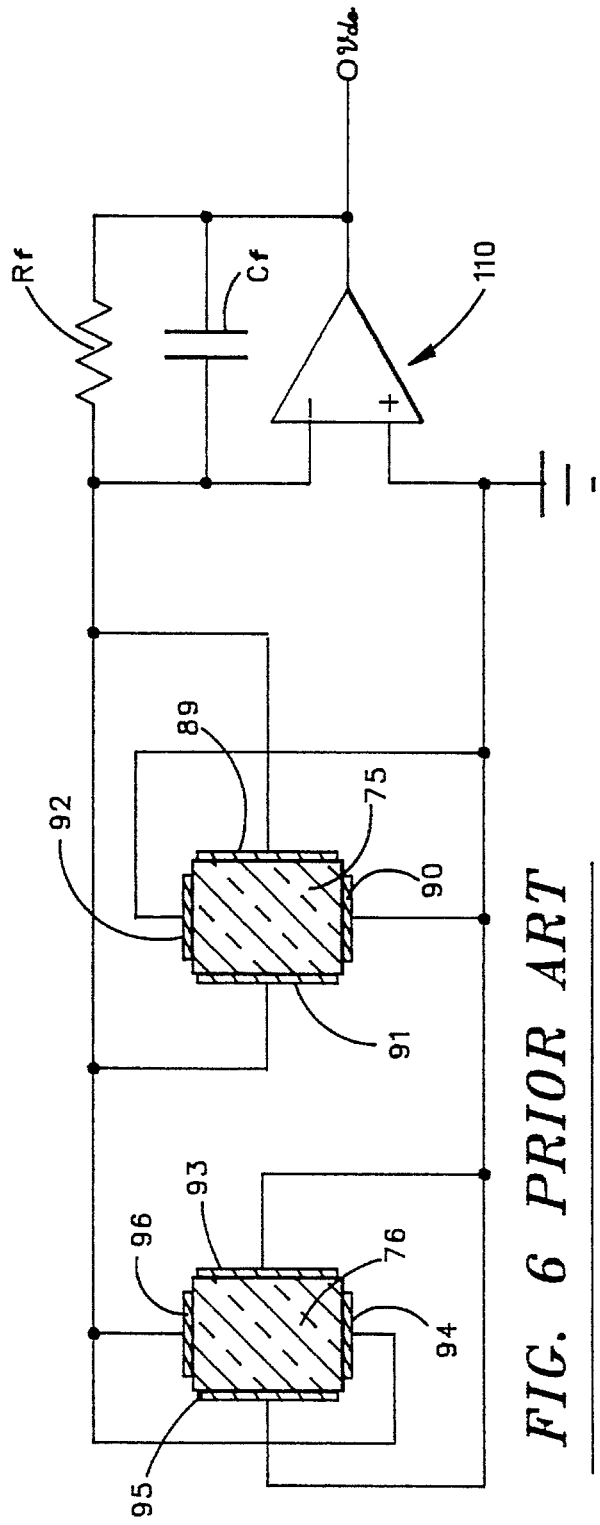
FIG. 6 is a cross-section of the drive tines of the quartz angular-rate sensor of FIG. 4 along section line 6—6 if FIG. 4.

To drive the drive tines 75, 76 at their resonant frequency, the drive tines are excited in response to sensing their elastic deformation. For this purpose, a second set of metal film electrodes 89 to 96, as further shown in FIG. 6, are disposed on the drive tines 75, 76 at locations of maximum elastic deformation where the tines are joined to the central portion of the H-shaped structure 72, as shown in FIG. 4. These electrodes 89 to 96 are connected to a conventional amplifier 110 providing a signal $v_{do}$ indicating the elastic deformation of the drive tines 75, 76.

As shown in FIG. 4, the vibration of the pick-up tines 77, 78 is sensed by metal film electrodes 101 to 108 deposited on the pick-up tines. As further shown in FIG. 7, the pick-up electrodes 101 to 108 are connected to a conventional amplifier 111 to provide a signal $v_r$ indicating the vibration of the pick-up tines.

Figure 7:
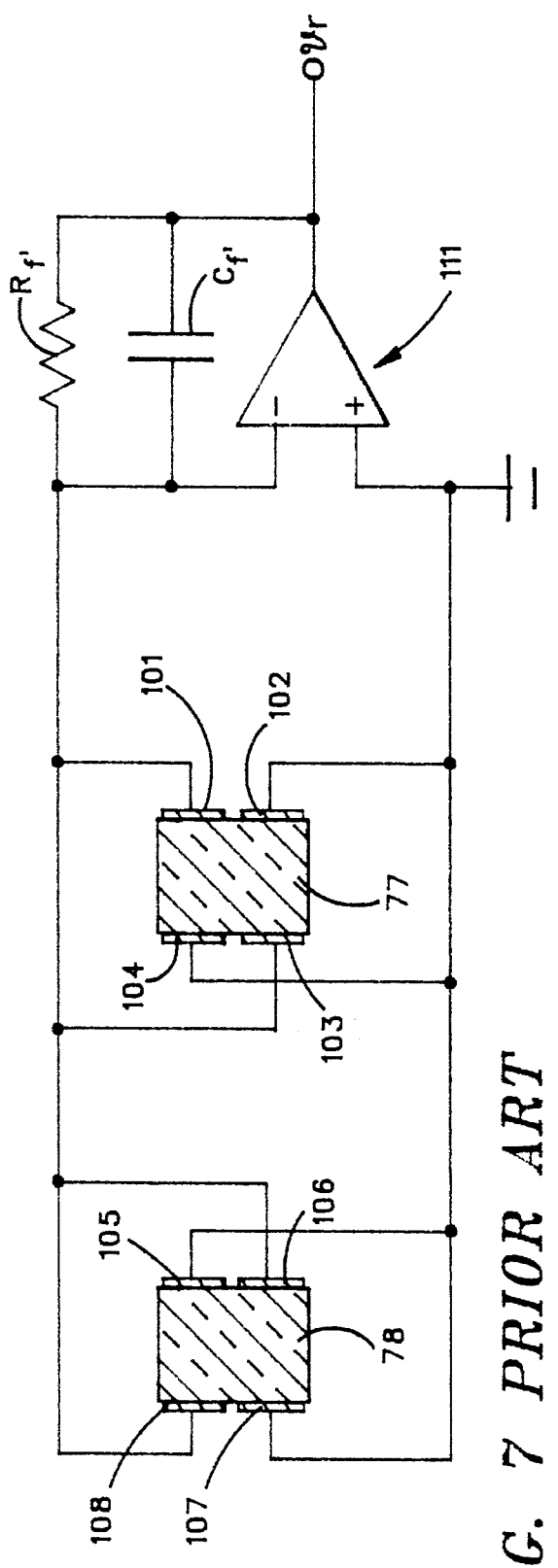
FIG. 7 is a cross-section of pick-up tines of the quartz angular-rate sensor of FIG. 4 along section line 7—7 in FIG. 4.
Figure 8:
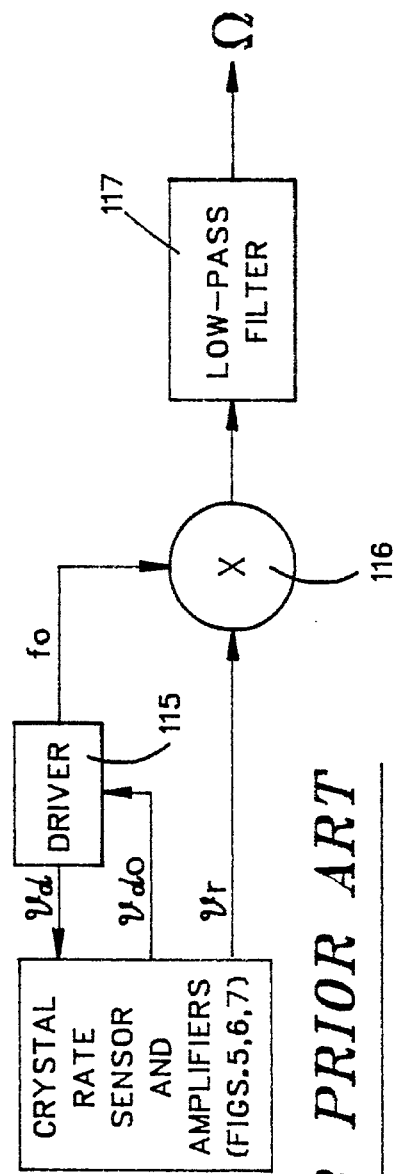
FIG. 8 is a block diagram of a conventional system for exciting the crystal rate sensor of FIG. 4 and synchronously detecting an angular-rate signal.

Turning now to FIG. 8, there is shown a conventional circuit for obtaining an angular-rate signal Ω from the crystal rate sensor and amplifiers as shown in FIGS. 5, 6, and 7. A driver circuit 115 is responsive to the signal $v_{do}$ to produce a drive signal $v_d$ at the resonant frequency of oscillation of the drive tines (75, 76 in FIG. 4). Moreover, the driver circuit 115 insures that the amplitude of vibration of the drive tines 75, 76 is substantially constant. Further, the driver 115 supplies a signal at the frequency of oscillation $f_o$ to a synchronous detector 116, such as a balanced modulator, that modulates the pick-up signal $v_r$ to detect the angular-rate information. A low-pass filter 117 extracts the angular-rate signal Ω from the output of the synchronous detector 116.

Figure 9:
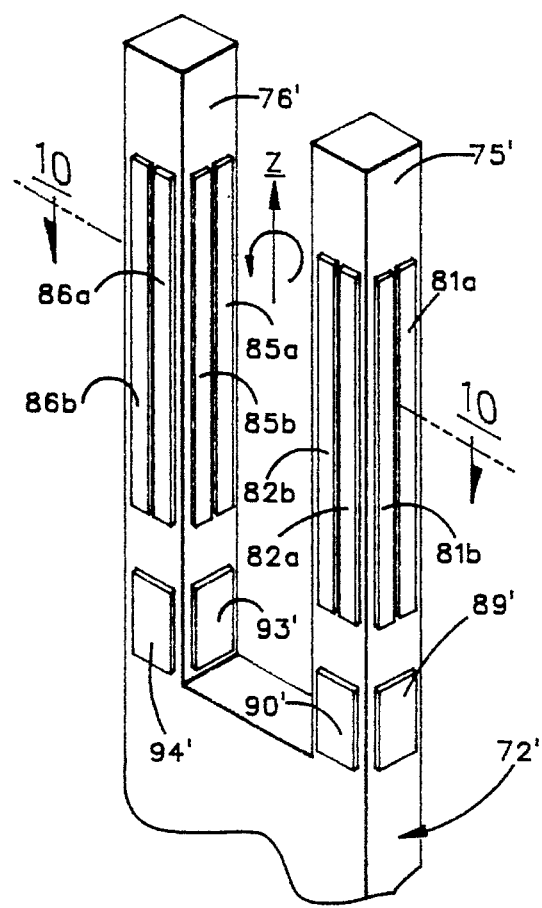
FIG. 9 is a perspective view showing an alternative construction for electrodes on drive tines of a quartz angular-rate sensor.
Figure 10:
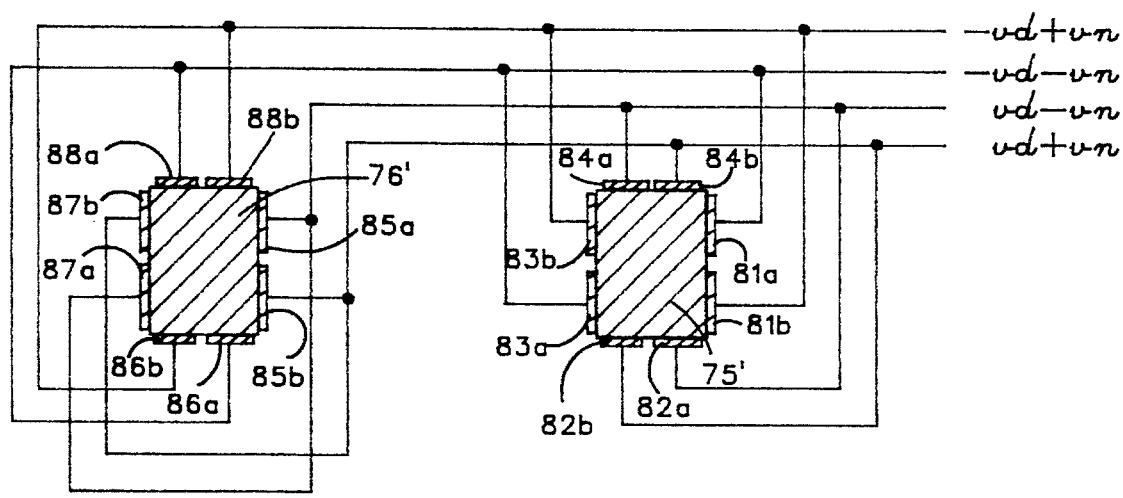
FIG. 10 is a cross-section of the drive tines of the quartz angular-rate sensor of FIG. 9 along section line 10—10 of FIG. 9.

Turning now to FIG. 9, there is shown an alternative construction in which pairs of drive electrodes 81a, 81b, to 88a, 88b, are deposited on the drive tines 75', 76', as further shown in FIG. 10. In this alternative construction, the drive electrodes 81a, 81b, to 88a, 88b are excited with a nulling signal $v_n$ in addition to the drive signal $v_d$. The nulling signal $v_n$ excites vibrations of the drive tines 75', 76' that directly couple to the pick-up tines (not shown), and therefore the nulling signal can be adjusted to minimize or null the vibration of the pick-up tines 77, 78.

Figure 11:
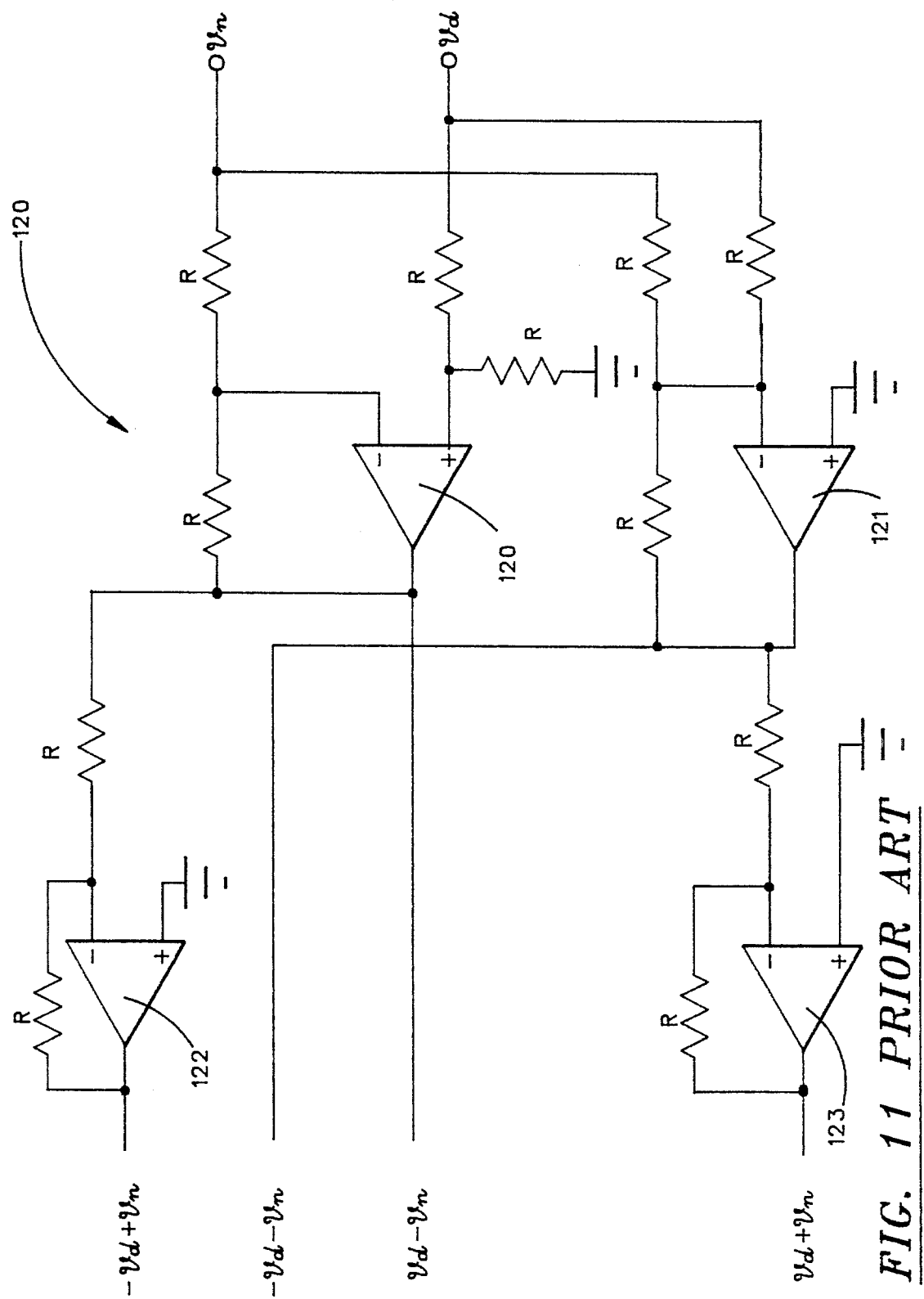
FIG. 11 is a schematic diagram of analog computational circuits for computing drive signals for the drive electrodes as shown in FIG. 10.

As shown in FIG. 11, analog computational circuits 120 receive a single-ended drive signal $v_d$ and a single-ended null signal $v_n$ to produce electrical signals ($-v_d+v_n$, $-v_d-v_n$, $v_d-v_n$, $-v_d-v_n$) that are applied to the pairs of drive electrodes (81a, 81b, to 88a, 88b in FIG. 10). These analog computational circuits 120 include an operational amplifier 120 wired as a differential amplifier, an operational amplifier 121 wired as an inverting summing amplifier, an operational amplifier 122 wired as an inverting unity gain amplifier, and an operational amplifier 123 wired as an inverting unity gain amplifier.

Figure 12:
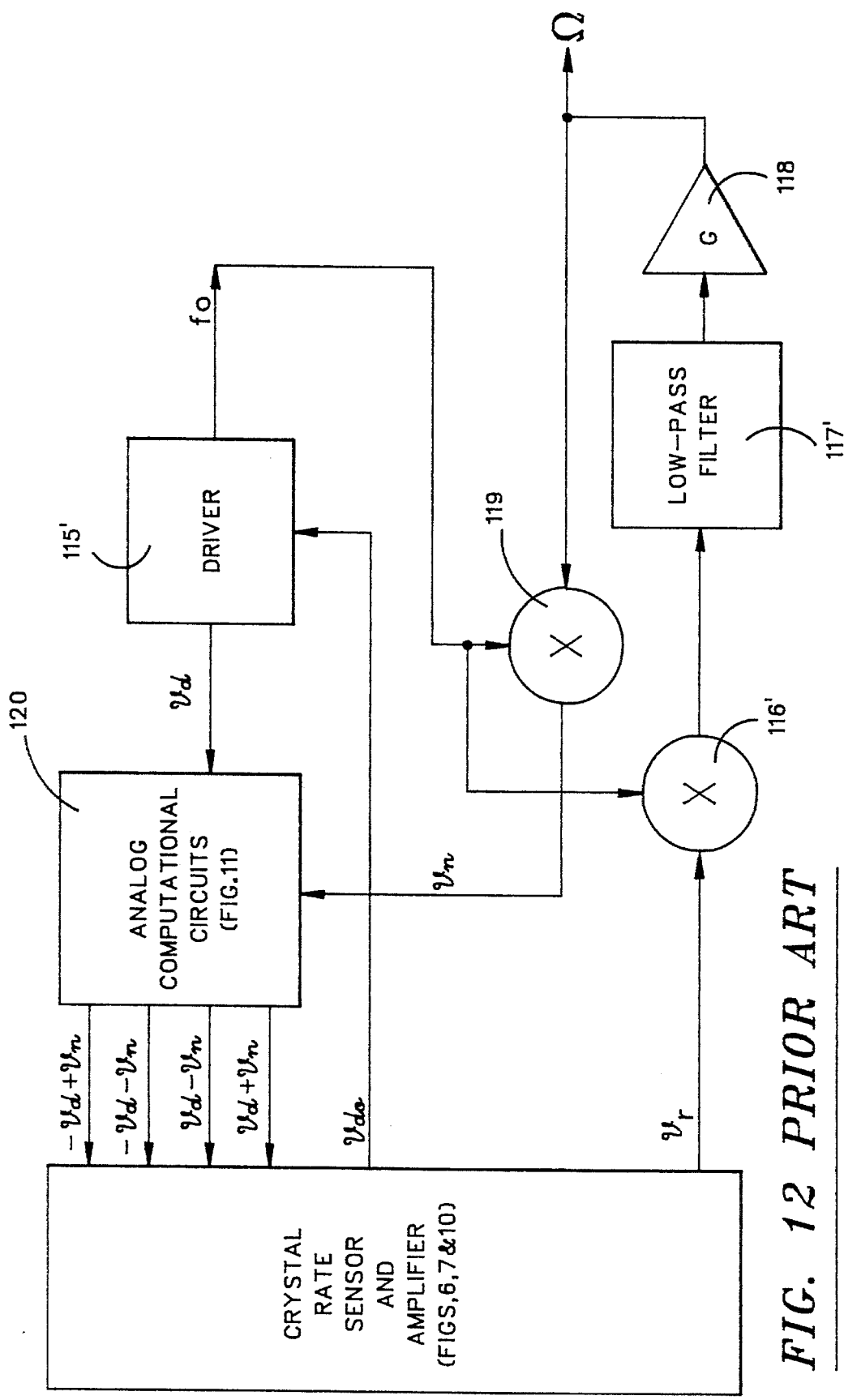
FIG. 12 is a conventional circuit for exciting the crystal rate sensor of FIG. 9 and synchronously detecting an angular-rate signal.

When the crystal rate sensor is operated such that a null signal $v_n$ nulls out the pick-up signal $v_r$, the crystal rate sensor is said to be operated in a "closed loop" mode. A circuit for operating the crystal rate sensor in such a "closed-loop" mode is shown in FIG. 12. The circuit includes a driver 115', a synchronous detector 116', and a low-pass filter 117' that are similar to the driver 115, synchronous detector 116, and low-pass filter 117 introduced in FIG. 8. However, the circuit in FIG. 12 further includes a baseband servo equalizer and feedback amplifier 118, a balanced modulator 119 for supplying the null signal $v_n$ at the frequency of oscillation $f_o$ but having an amplitude controlled by negative feedback to null out the pick-up signal $v_r$, and the analog computational circuits 120 shown in FIG. 11. Therefore, the amplifier 118 provides the angular-rate signal $\Omega$.

Figure 13:
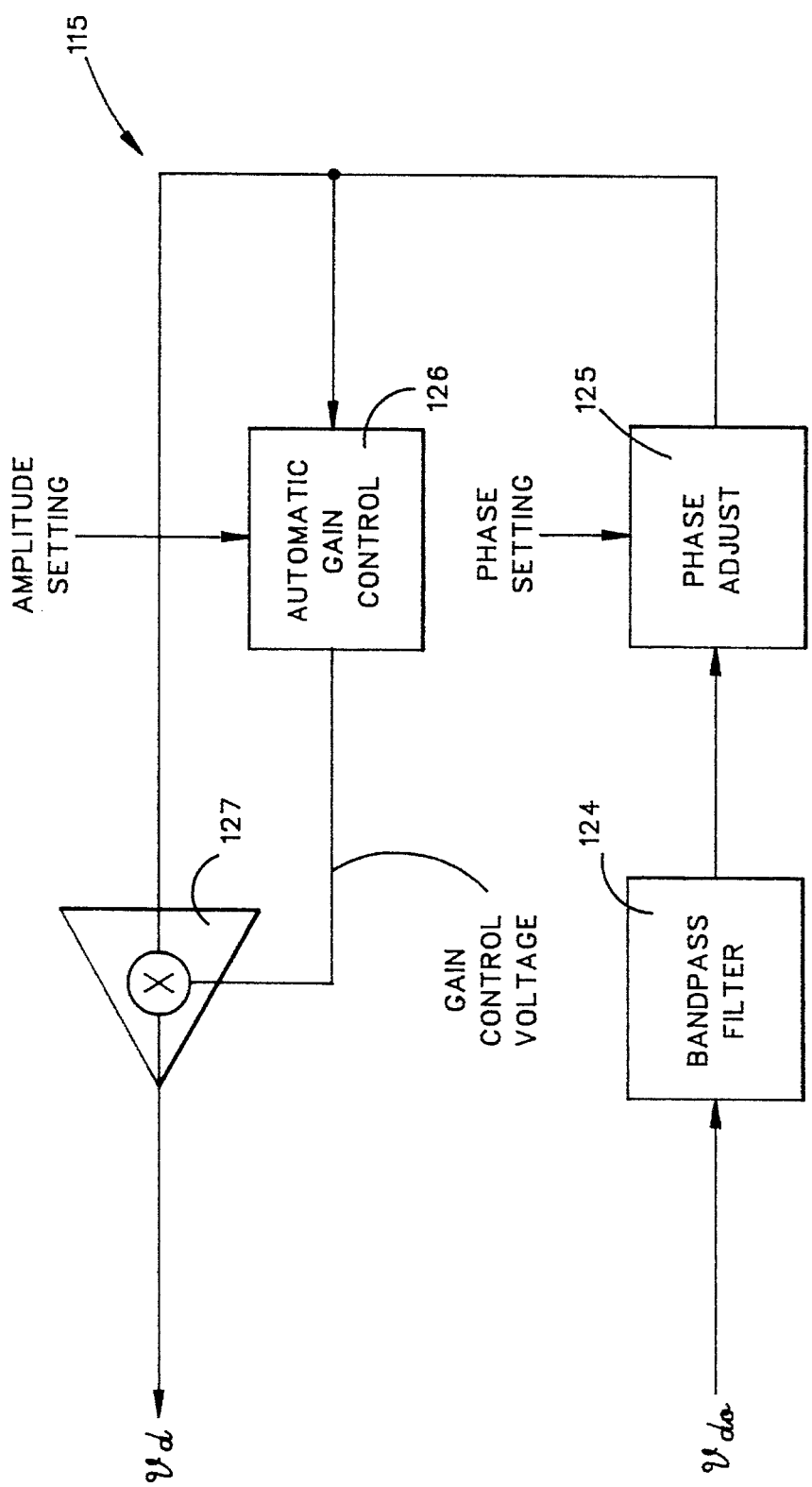
FIG. 13 is a block diagram of an analog drive circuit used in FIG. 12 for exciting the crystal rate sensor.

Turning now to FIG. 13, there is shown a block diagram for the driver circuit 115 of FIG. 8. The driver circuit 115 includes a bandbass filter 124 that filters the $v_{do}$ signal and is tuned for a maximum response at the resonant frequency $f_o$ of the drive tines. The output of the bandpass filter 124 is fed through a phase-adjusting circuit 125 that is adjusted for (360)(n) degree (n is any integer) phase shift around the entire drive loop, through the drive electrodes (81 to 88 in FIGS. 4 and 5), through the physics of the drive fork, through the drive sensing electrodes (89 to 96 in FIGS. 4. and 6), and through the electronics in FIG. 13. The output of the phase-adjusting circuit is fed to an automatic gain control 126 that senses the amplitude of the signal from the phase-adjusting circuit and generates a gain control voltage responsive to the difference between the amplitude of the signal from the phase-adjusting circuit 125 and an amplitude setting. The amplitude setting may be adjusted, for example, in response to calibrating the angular-rate sensor by subjecting the sensor to a precise rate of angular rotation and adjusting the amplitude setting so that the angular-rate signal $\Omega$ precisely indicates the rate of angular rotation. The gain-control voltage from the automatic gain control adjusts the gain of a linear amplifier 127 that amplifies the output of the phase-adjusting circuit 125 to produce the drive signal $v_d$. The linear amplifier, for example, is an operational transconductance amplifier, such as RCA part No. CA3080.

Figure 14:
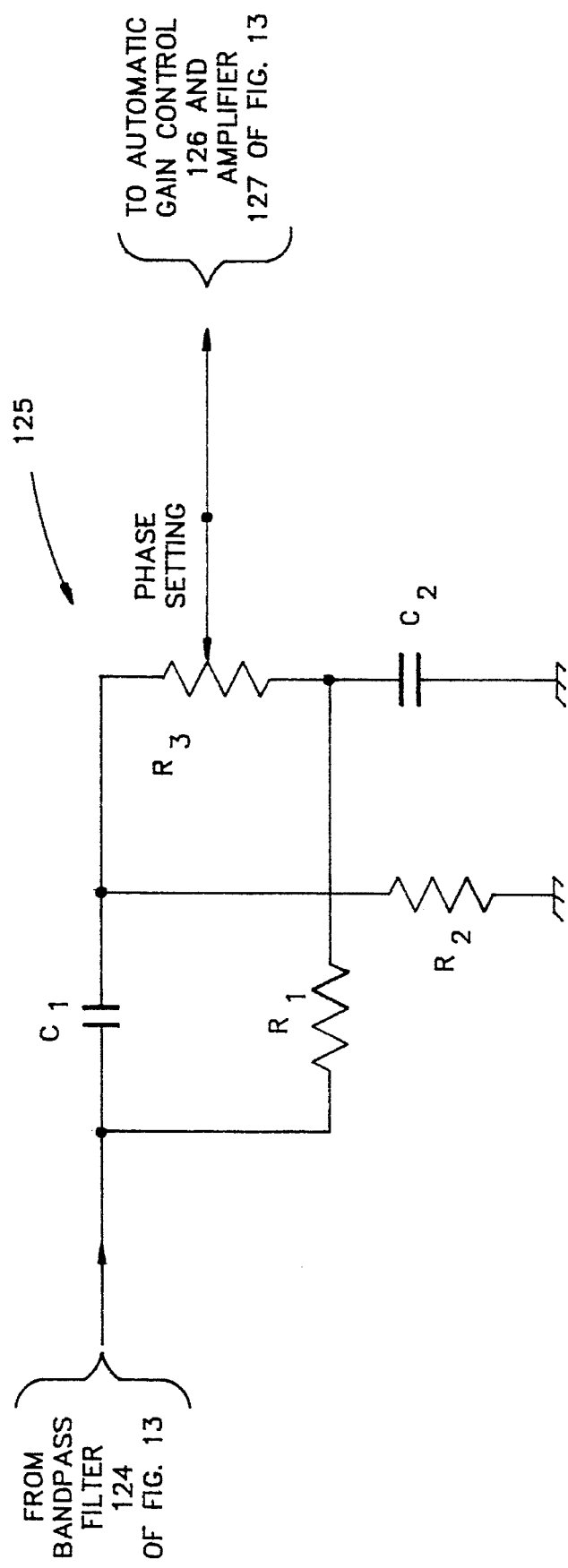
FIG. 14 is a schematic diagram of a phase-adjusting circuit used in FIG. 13.

Turning now to FIG. 14, there is shown a schematic diagram for the phase-adjusting circuit 125. The phase-adjusting circuit is a lead-lag network having resistances $R_1$, $R_2$, $R_3$ and capacitances $C_1$, $C_2$ such that $R_1=1/\omega C_1$, $R_2=1/\omega C_2$, and $R_3>R_2>>R_1$, where $\omega=2\pi f_o$. The resistance $R_3$ is a potentiometer, which can be adjusted for a phase shift of about $\pm(45°)(R_1/R_2)$.

Figure 15:
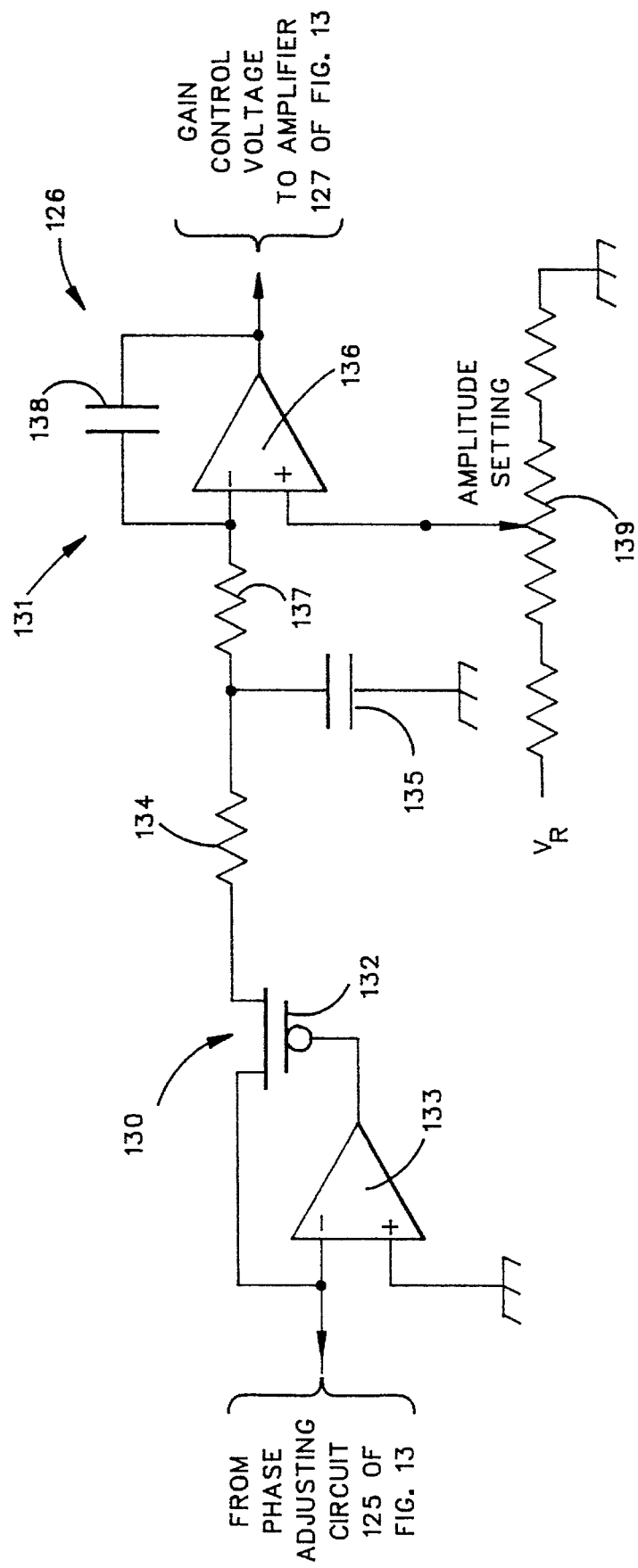
FIG. 15 is a schematic diagram of an automatic gain control circuit used in FIG. 13.

Turning now to FIG. 15, there is shown a schematic diagram for the automatic gain control circuit 126. The automatic gain control circuit includes an amplitude detector 130 and an integrating comparator 131. The amplitude detector 130 has an N-channel MOS-FET 132 that is turned on and off by a voltage comparator 133 responsive to the polarity of the signal from the phase-adjusting circuit 125. Therefore, the N-channel MOS-FET functions as a half-wave rectifier. The rectified signal is low-pass filtered by a series resistor 134 and a shunt capacitor 135, so that the voltage on the capacitor 135 indicates the amplitude of the signal from the phase-adjusting circuit 125. The integrating comparator is an operational amplifier 136 having an input resistor 137 and a feedback capacitor 138 connected to the negative input of the operational amplifier. The positive input of the operational amplifier 136 receives an amplitude setting voltage from a potentiometer 139. The potentiometer 139 is excited by a constant reference voltage $V_R$. The output of the operational amplifier 136 provides the gain control voltage to the amplifier 127 of FIG. 13.

The present invention provides a very precise method of detecting the angular-rate signal $\Omega$. The detection method is so precise that a conventional driver circuit (115 in FIG. 13) can be a source of error in the detected angular-rate signal $\Omega$. Possibly, the manufacturers of the quartz rate sensors will develop more precise driver circuits. Otherwise, it would be desirable to use digital techniques for generating the drive signal $v_d$ to the quartz rate sensor, since digital techniques can provide amplitude and phase stability that is superior to the amplitude and phase stability of analog circuits.

Figure 16:
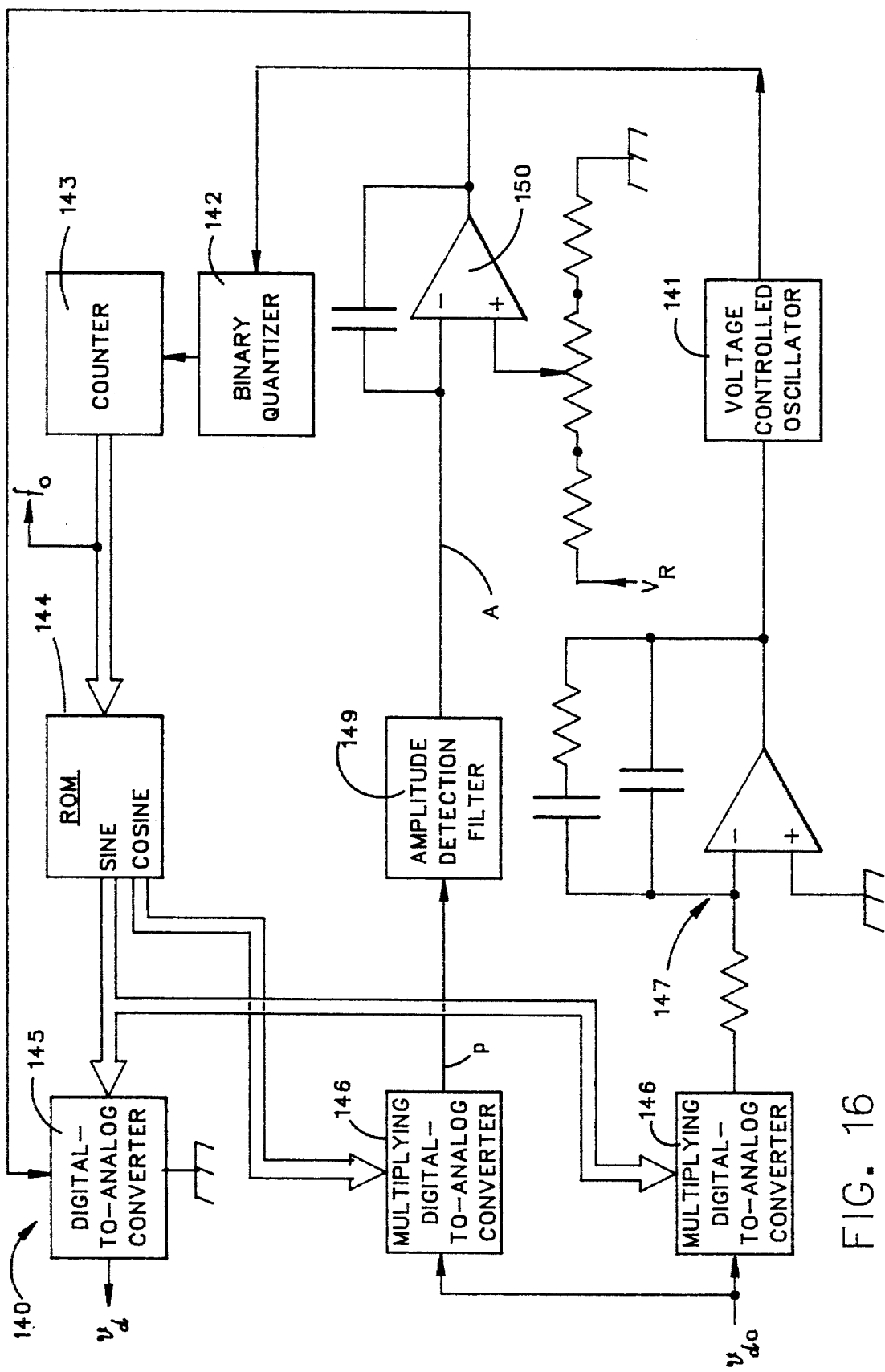
FIG. 16 is a block diagram of a driver circuit using digital techniques for exciting a quartz angular-rate sensor.

Turning now to FIG. 16, there is shown a driver circuit 140 using digital techniques for generating the drive signal $v_d$. The driver 140 has a high-frequency, voltage-controlled oscillator 141 that is phase-locked to the elastic vibrations of the drive tines as indicated by the signal $v_{do}$. The output of the voltage-controlled oscillator 141 is quantized in a binary quantizer 142 such as a Schmitt trigger or limiter such as a string of inverters. The purpose of the binary quantizer 142 is to generate a digital clocking signal suitable for clocking a counter 143. The clocking signal, for example, has one pulse per cycle of the input signal to the binary quantizer 142. The counter 143 divides the frequency of the voltage-controlled oscillator 141 to provide a signal at the frequency of oscillation $f_o$ of the drive tines. The numerical value from the counter 143 represents the phase of oscillation.

In the circuit of FIG. 16, the drive signal $v_d$ is generated by addressing a sine table in a read-only memory (ROM) 144 with the numerical value from the counter 143. The sine value is converted in a digital-to-analog converter 145 to produce the drive signal $v_d$.

To compare the phase of the signal from the VC0 141 to the phase of the elastic vibrations of the drive tines, the sine value from the ROM 144 is applied to a multiplying digital-to-analog converter 146 that receives as its voltage reference the signal $v_{do}$. As is well-known, a multiplying digital-to-analog converter is a digital-to-analog converter that accepts a reference voltage $V_R$ and provides an analog output ranging from $+V_R$ to $-V_R$ so that the analog-to-digital converter may function as a balanced modulator. One conventional form of construction for a multiplying DAC has two analog buffer amplifiers of gain +1 and -1, respectively, to provide buffered voltage references $+V_R'$ and $-V_R'$; a CMOS analog multiplexer for each input bit selecting either $+V_R'$ or $-V_R'$; and an R/2R ladder connecting the analog output of each analog multiplexer to the output of the multiplying DAC.

The output signal of the multiplying digital-to-analog converter 146 is applied to an integrating filter 147 that provides a phase-error signal to the voltage-controlled oscillator 141. The integrating filter 147 is a conventional lead-lag charge-pump filter that insures that the average phase error of the phase-lock loop is zero. When the phase-lock loop is phase-locked, there will be approximately (360)(n) degrees (n is any integer) of phase shift through the quartz rate sensor from the drive electrodes 81 to 88 in FIG. 5 to the drive sensing electrodes 89 to 96 in FIG. 6. The circuit of FIG. 6 is designed assuming that there is a 90° phase shift through the amplifier 110. In other words, the amplifier 110 functions as a "charge amplifier" or integrator at the frequency $f_o$, because the feedback capacitance $c_f$ is selected to be about 5 to 10 times the product of $2\pi f_o$ and the feedback resistance $R_f$. Preferably, the amplifier 111 in FIG. 7 is also a "charge amplifier" or integrator at the frequency $f_o$.

In order to drive the drive tines to excite elastic vibrations of substantially constant amplitude, the circuit in FIG. 16 has an automatic gain control loop including a multiplying digital-to-analog converter 148, an amplitude detection filter 149, and an integrating voltage comparator 150 that provides the reference voltage for the digital-to-analog converter 145 that drives the drive tines. The multiplying digital-to-analog converter 148 receives the signal $v_{do}$ as its voltage reference, and receives a digital cosine value from the ROM 144. The amplitude detection filter 149 is a low-pass filter having a notch at $2f_o$.

Figure 17:
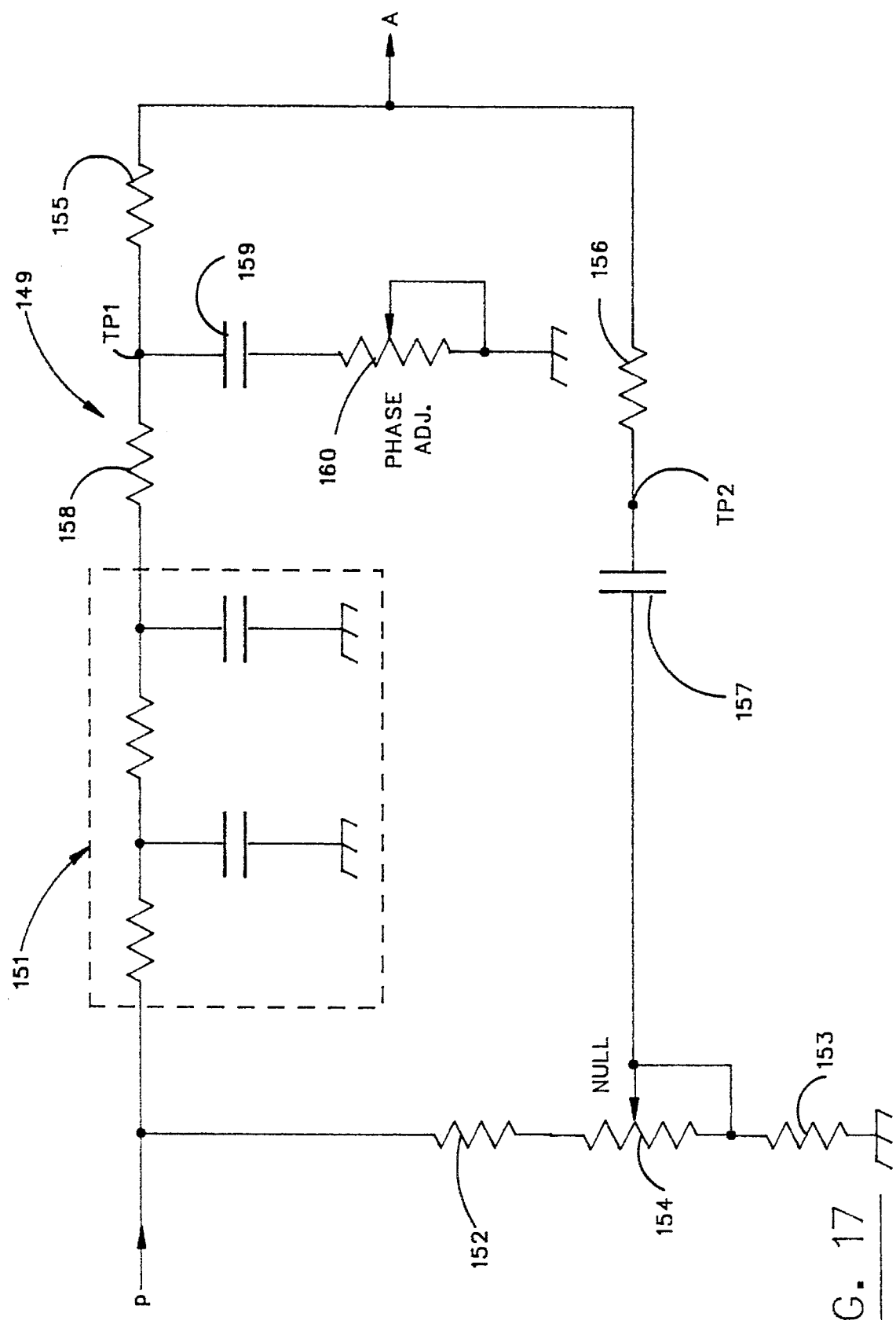
FIG. 17 is a schematic diagram of an amplitude detection filter used in FIG. 16.

Turning now to FIG. 17, there is shown a schematic diagram of the amplitude detection filter 149 of FIG. 16. The amplitude detection filter 149 includes a second-order low-pass filter 151 that provides nearly a 180° phase shift at twice the frequency $f_o$. In order to null out the product at $2f_o$ from the output (p) of the multiplying digital-to-analog converter (148 in FIG. 16), the output (p) is reduced in amplitude by a voltage divider including resistors 152, 153 and a variable resistor 154. A pair of equal-valued summing resistors 155, 156 sum the output of the filter 151 with the output of the voltage divider. A DC blocking capacitor 157 is connected between the variable resistor 154 and the summing resistor 156. To obtain a very deep notch at $2f_o$, a resistor 158, a capacitor 159, and a variable resistor 160 can also be used so that by adjusting the variable resistor 160, the phase of the $2f_o$ signal at a test point TP1 will have a phase shift of precisely 180° with respect to the signal at the test point TP2. Therefore, the variable resistor 154 can be adjusted to cancel the $2f_o$ signal from the amplitude signal A.

Figure 18:
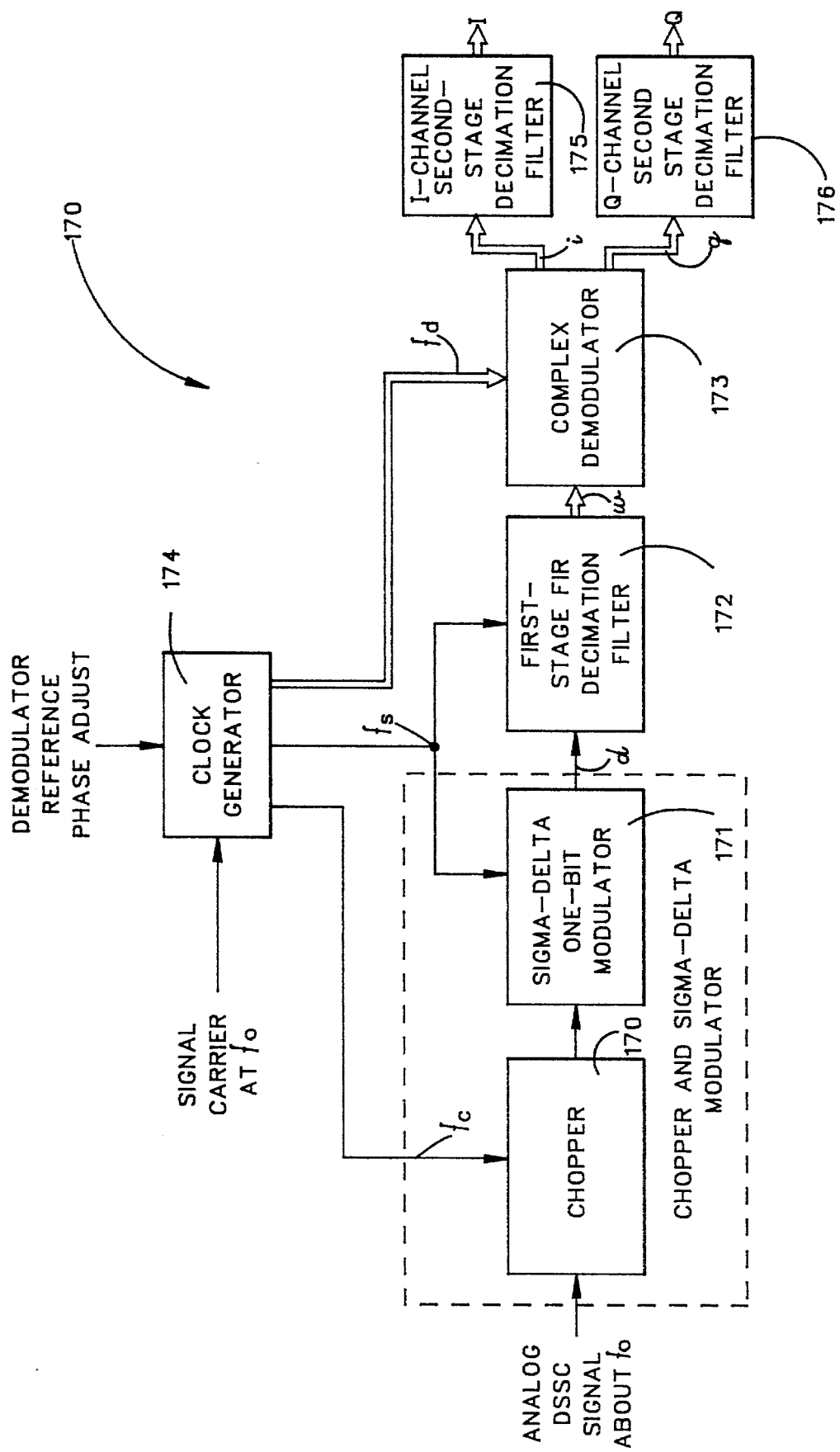
FIG. 18 is a block diagram of a heterodyne detector using a chopper in connection with a sigma-delta modulator in accordance with the present invention.

In accordance with an important aspect of the present invention, a chopper is used in connection with a sigma-delta one-bit modulator for demodulating an analog double-sideband suppressed carrier (DSSC) signal about a suppressed carrier at a frequency of $f_o$. A block diagram of such a demodulator circuit 170 is shown in FIG. 18. The analog double-sideband suppressed carrier (DSSC) signal, for example, is the pick-off signal $v_r$ from FIG. 7, and the pick-off signal is demodulated to provide the angular-rate signal $\Omega$.

The DSSC signal is chopped by a chopper 170 at a chopping frequency $f_c$, so that the DSSC signal is down-converted to an intermediate frequency of $f_d = |f_o - f_c|$. Down conversion to an intermediate frequency for further digital processing avoids offset and spectral-artifact problems that would occur if direct down conversion to baseband were attempted with the chopper 170. The down-converted DSSC signal is modulated by a one-bit sigma-delta modulator 171 so that it is represented by a binary signal (d) at a rate $f_s$, which is the "sampling rate" of the sigma-delta modulator. The binary signal (d) is filtered in a first stage finite-impulse-response (FIR) decimation filter 172.

The first stage FIR decimation filter provides multi-bit words at a slower rate than the sampling rate $f_s$. The digital decimation filter 172, for example, provides multi-bit words at a rate of at least twice $f_d$, and preferably at least four times $f_d$. For detecting an angular-rate signal from the angular-rate sensor of FIG. 4, for example, the difference frequency $f_d$ is within the range of 300 to 500 Hz and the word rate from the digital decimation filter 175 is at least 1,200 to 2,000 KHz. The digital decimation filter 175 therefore may have a construction similar to the digital decimation filter that is used in an audio-frequency-range sigma-delta analog-to-digital converter. In contrast, the sampling rate $f_s$ is a high rate, perhaps three orders of magnitude greater than $f_d$. Preferably, the digital decimation filter 172 is a finite impulse response (FIR) filter having suitable attenuation at the chopping frequency $f_c$. The simplest construction for such a FIR filter is a counter that accumulates the signal (d) over an integral number of periods of the chopping frequency $f_c$. The sigma-delta one-bit modulator 171 and the first-stage FIR decimation filter 172 could have a construction similar to that described in Ferguson et al., "An 18b 20 KHz Dual ΣΔA/D Converter," 1991, I.E.E.E. International Solid-State Circuits Conference, Digest of Technical Papers, pp. 68–69 and 272, or in Early, "Chopper Stabilized Delta-Sigma Analog-to-Digital Converter," U.S. Pat. No. 4,939, 516, issued Jul. 3, 1990, incorporated herein by reference.

The digital words (w) from the digital decimation filter 172 are fed to a complex demodulator 173 that effectively multiplies the words (w) by an in-phase reference signal and a quadrature-phase reference signal at the intermediate frequency $f_d$ to provide an in-phase product (i) and a quadrature-phase product (q), respectively. In accordance with an aspect of the present invention, the reference signals at the intermediate frequency $f_d$ are square waves. The use of square waves, rather than sine and cosine reference signals, does not result in any loss of performance whatsoever, because the frequencies $f_o$, $f_c$, $f_s$, and $f_d$ are phase-locked in a predetermined phase relationship by a clock generator circuit 174, as further described below. Any aliases introduced by the use of square waves either cancel or fall on integer multiples of the output data rate. The clock generator circuit 174 is further described below with reference to FIG. 19, and the digital demodulator is further described below with reference to FIG. 20.

The in-phase product (i) is fed to an in-phase channel second-stage digital decimation filter 175 providing an in-phase detected signal I, and the quadrature-phase product (q) is fed to a quadrature-phase channel second-stage digital decimation filter 176 to provide a quadrature-phase detected signal Q. Because the circuit of FIG. 18 provides both in-phase and quadrature-phase detected signals, any phase shift or tuning error between the signal $f_o$ and the suppressed carrier in the pick-off signal $v_r$ can be corrected by a rotation of the complex vector I+iQ, and this rotation can be performed by a phase adjustment of the in-phase and quadrature-phase reference signals used by the complex demodulator 173. Such a phase adjustment is made by a demodulator reference phase adjustment input to the clock generator 174. For example, all of the detected angular-rate signal should appear in the in-phase channel I of FIG. 14. In practice, however, there will be some phase offset causing some of the angular-rate signal to appear in the quadrature-phase channel Q.

In general, the angular-rate signal $\Omega$ should have a sign that is the sign of the signal in the in-phase channel I and a corrected magnitude equal to the square root of $I^2 + Q^2$. In fact, imperfections within the instrument, alignment errors, and capacitive coupling cause extraneous contributions to the I and Q signals which should be eliminated by calibration and post-processing processing by computing $\Omega$ from the signals I and Q after removal of the extraneous contributions. Compensation for the extraneous contributions could be performed by referencing calibration data retrieved from calibration tables programmed in non-volatile memory.

Figure 19:
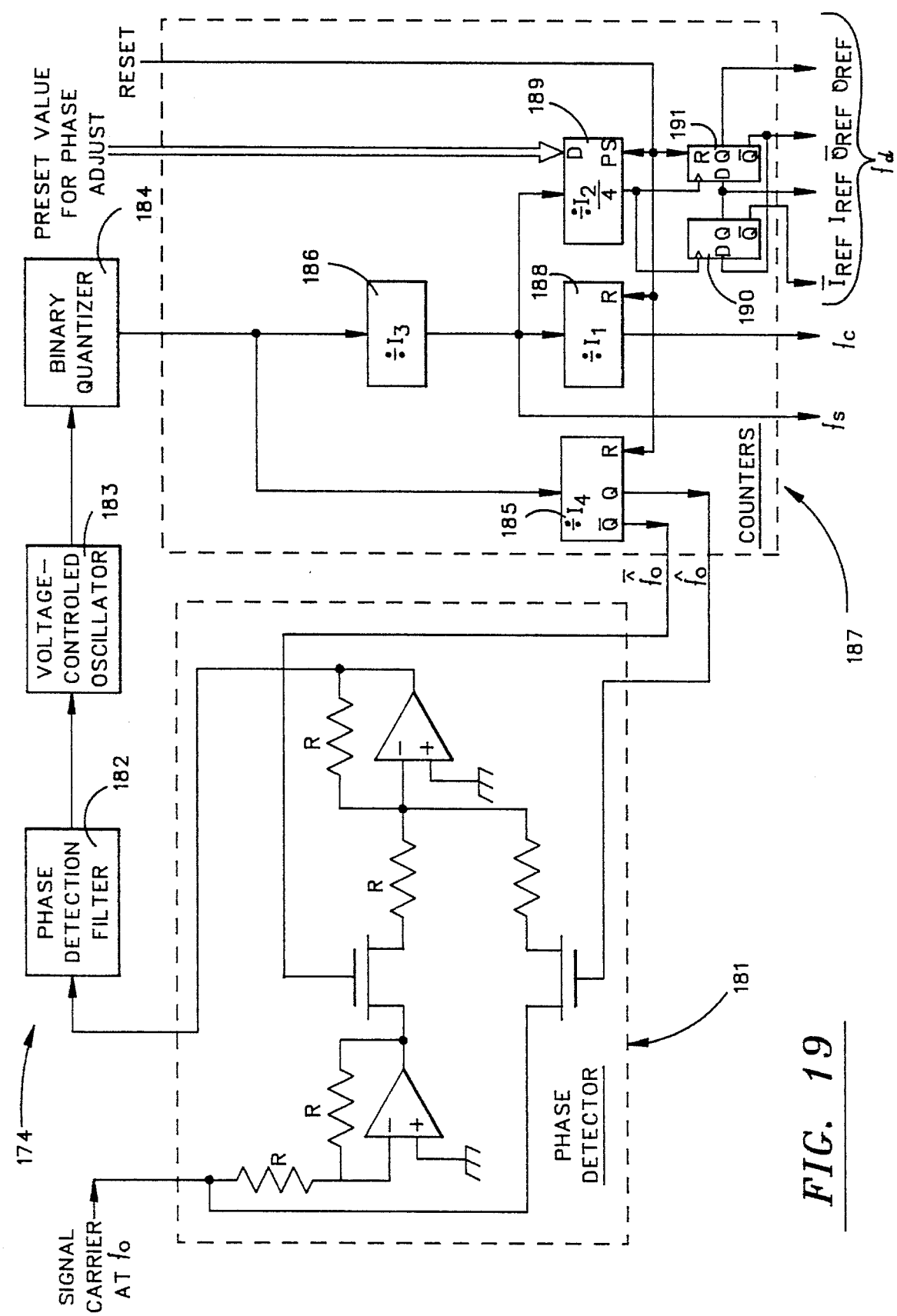
FIG. 19 is a block diagram of a clock generator circuit used in FIG. 18.

Turning now to FIG. 19, there is shown a schematic diagram for the clock generator 174. The clock generator 174 includes a phase-locked loop for phase-locking the signals $f_s$, $f_c$, and $f_d$ in a predetermined phase relationship to the signal carrier at $f_o$. This phase-locked loop includes a phase detector or multiplier 181, a phase detection filter 182, a voltage controlled oscillator 183, a binary quantizer 184, and a counter 185. For detecting an angular-rate signal from the quartz rate sensor of FIG. 4, for example, the signal carrier at $f_o$ is the signal $v_{do}$, the phase detector 181 is a one-bit multiplying DAC as shown in FIG. 19, the phase detection filter 182 is similar to the lead-lag integrating filter 147 of FIG. 16, the voltage-controlled oscillator 183 is similar to the voltage-controlled oscillator 141 of FIG. 16, the binary quantizer 184 is similar to the binary quantizer 142 of FIG. 16, and the counter 185 is similar to the counter 143 in FIG. 16.

As shown in FIG. 19, the clock generator circuit 174 includes a number of digital dividers or counters 187 that are clocked by the voltage-controlled oscillator 183. A divider 186 divides the frequency of the voltage-controlled oscillator by an integer $I_3$ to generate the sampling frequency $f_s$. Therefore, the sampling frequency $f_s$ becomes phase-locked to the frequency of oscillation $f_o$. A counter 188 divides the sampling frequency $f_s$ by an integer $I_1$ to obtain the chopping frequency $f_c$. A counter 189 and a pair of D flip-flops 190 and 191 divide the sampling frequency $f_s$ by another integer $I_2$ to obtain the difference frequency $f_d$. The integer $I_2$ is greater than the integer $I_1$, and further, the two integers $I_1$ and $I_2$ are selected so that:

$$f_d = |f_o - f_c|$$

$$\pm f_d = f_o - f_c$$

But $f_o = \frac{I_3}{I_4} f_s, f_c = \frac{f_s}{I_1}, f_d = \frac{f_s}{I_2}$

So that $\pm \frac{1}{I_2} = \frac{I_3}{I_4} - \frac{1}{I_1}$ $$\pm I_1 I_4 = I_1 I_2 I_3 - I_2 I_4$$

$$(I_2 \pm I_1) I_4 = I_1 I_2 I_3$$

$$\frac{I_2 \pm I_1}{I_1 I_2} = \frac{I_3}{I_4}$$

Therefore $\frac{I_1 I_2}{I_2 \pm I_1} = \frac{I_4}{I_3}$.

For the special case when the quantity $I_1 I_2/(I_2 \pm I_1)$ is an integer, then $I_3$ can be one, and therefore the counter 186 can be eliminated.

Phase-locking of the signals $f_s$, $f_o$, $f_c$, and $f_d$ is used to avoid problems due to aliasing or fold-over distortion with respect to harmonics of the various frequencies. The D flip-flops 190 and 191 are wired as a divide-by-four shift counter to provide an in-phase demodulator reference signal and a quadrature-phase demodulator reference signal at the difference frequency $f_d$. A more specific example of circuits for the counters 187 will be described below with reference to FIG. 24.

Figure 20:
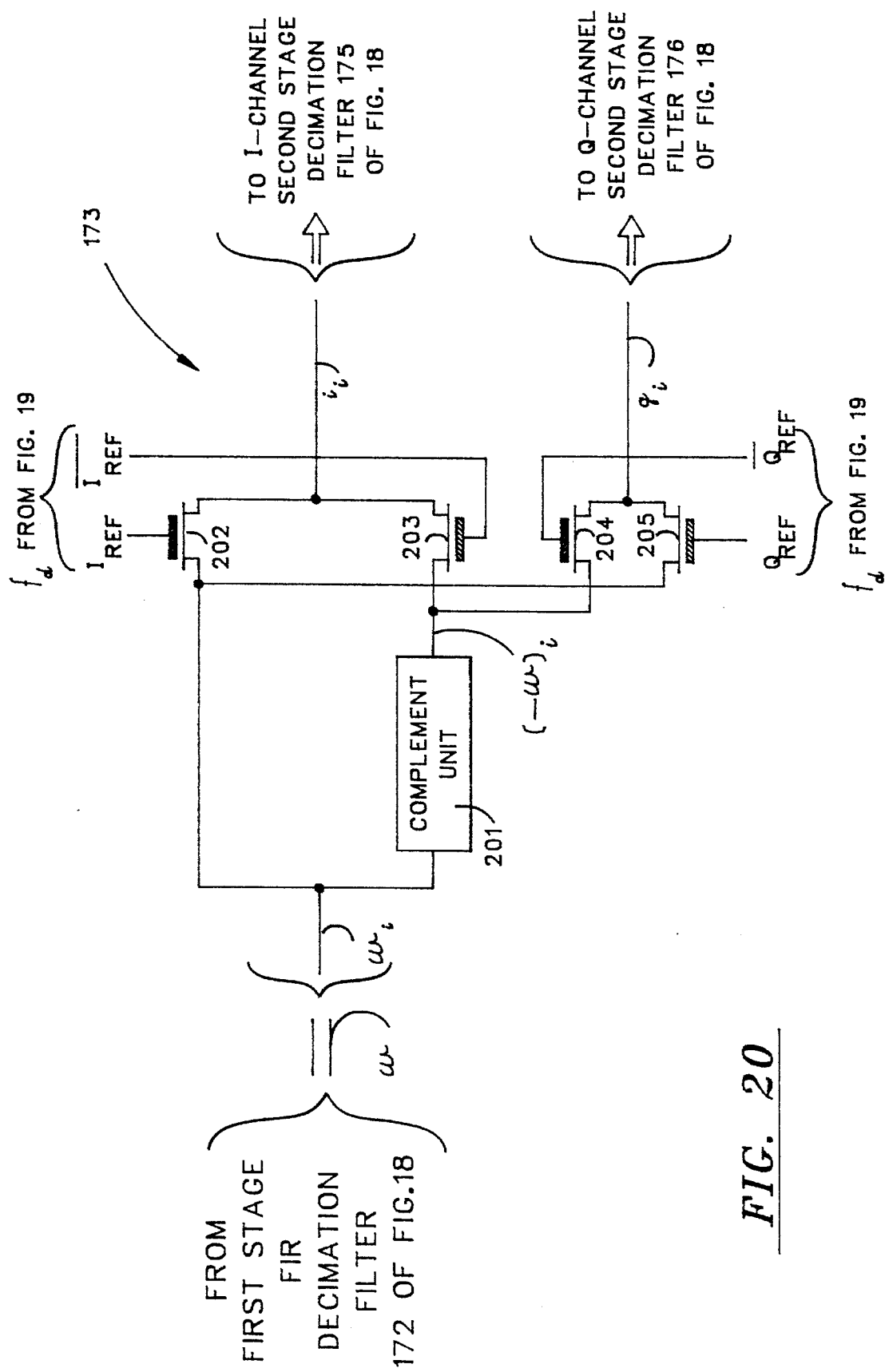
FIG. 20 is a schematic diagram of a complex demodulator used in FIG. 18.

Turning now to FIG. 20, there is shown a schematic diagram of the complex demodulator 173 introduced in FIG. 18. As shown in FIG. 20, the digital words (w) from the first stage FIR decimation filter are selectively complemented by the demodulator reference signals. FIG. 20 shows the wiring for one bit $w_i$ of the multi-bit word (w) from the first stage FIR decimation filter (172 of FIG. 8). A complement unit 201 complements the multi-bit word (w) to produce a complement (−w). The first-stage FIR decimation filter, for example, provides data words (w) that represent both positive and negative numbers, and the negative numbers are encoded in a "two's complement" binary representation. In this case, the complement unit 201 computes the two's complement (−w) of the data word (w) by inverting each bit in the data word (w) to form a "one's complement" data word and then adding one to the "one's complement" data word to compute a sum that is the "two's complement."

The complex demodulator includes four transmission gates or NMOS-FETs 202, 203, 204, and 205 controlled by respective ones of the demodulator reference signals $I_{REF}$, $I_{REF}$ complement, $Q_{REF}$, and $Q_{REF}$ complement. Either the NMOS-FET 202 or the NMOS-FET 203 is enabled to select either the bit $w_i$ or the bit $(-w)_i$ to be passed as the ith bit $(i_i)$ of the in-phase product signal (i), which is supplied to the I-channel second-stage decimation filter (175 of FIG. 18). Either the NMOS-FET 204 or the NMOS-FET 205 is enabled no select either the bit $w_i$ or the bit $(-w)_i$ to be passed as the ith bit $(q_i)$ of the quadrature-phase product signal (q), which is supplied to the Q-channel second-stage decimation filter (176 of FIG. 18).

Turning now to FIGS. 21A, 21B, and 21C, there are shown graphs of signal spectra that illustrate the down-conversion process performed by the chopper 170 of FIG. 18, where k images are placed between the original spectral element 211 and zero frequency. Usually, but not always, k will be selected to be equal to one by choosing $f_c$ to be close to $f_o$. As shown in FIG. 21A, the spectrum 211, 212 of the pick-off signal is centered around the frequency $f_o$ and deviates from the frequency $f_o$ by the bandwidth $\Delta f$ of the angular-rate signal $\Omega$. When the pick-off signal $v_r$ is chopped at the frequency $f_c$, the resulting baseband spectra 213, 214, 215, 216 at the difference frequency $f_d = |f_o - (k)(f_c)|$ is either non-inverted as shown in FIG. 21B, or is inverted as shown in FIG. 21C. When k=1, the baseband spectra is non-inverted when $f_o > f_c$, and inverted when $f_o < f_c$.

To prevent aliasing at baseband, it is necessary for the difference frequency $f_d$ to be greater than the bandwidth $\Delta f$. In other words, for the non-inverted case, $$-\Delta f + f_o - k f_c > 0, \therefore f_c < \frac{f_o - \Delta f}{k}$$

For the inverted case, $$-\Delta f - f_o + k f_c > 0, \therefore f_c > \frac{f_o + \Delta f}{k}$$

There are, however, other constraints on selecting the chopping frequency $f_c$ in the system of FIG. 18. The I and Q signals of FIG. 14 are more easily filtered by the digital decimation filters 175, 176 when the difference frequency is at least about six times $\Delta f$. Another consideration is leakage through and nonlinearities in the chopper, reinforcing the spectral images 217, 218 in FIG. 21B, and 219, 220 in FIG. 21C. So that these images do not alias with the baseband images 213, 214 or 215, 216, it is necessary, in the non-inverted case, that:

$$\Delta f + f_o - k f_c < f_c/2, \therefore f_c > \frac{f_o + \Delta f}{k + \frac{1}{2}}$$

Combining this constraint with the above constraint for avoiding aliasing at baseband, in the non-inverted case:

$$\frac{f_o - \Delta f}{k} > f_c > \frac{f_o + \Delta f}{k + \frac{1}{2}}$$

$$k < \frac{f_o - \Delta f}{4\Delta f} \text{ so } k_{max} = \left\lfloor \frac{f_o - \Delta f}{4\Delta f} \right\rfloor$$

For the non-inverted case, for k=1:

$$f_o - \Delta f > f_c > \frac{2}{3}(f_o + \Delta f)$$

For the inverted case, to avoid aliasing from leakage through and nonlinearities in the chopping, it is necessary that:

$$-f_o + kf_c + \Delta f < f_c/2, \therefore f_c < \frac{f_o - \Delta f}{k - \frac{1}{2}}$$

Combining this constraint with the above constraint for avoiding aliasing at baseband, in the inverted case:

$$\frac{f_o - \Delta f}{k - \frac{1}{2}} > f_c > \frac{f_o + \Delta f}{k}$$

$$k < \frac{f_o + \Delta f}{4\Delta f} \text{ so } k_{max} = \left\lfloor \frac{f_o + \Delta f}{4\Delta f} \right\rfloor$$

It is assumed in FIGS. 21B and 21C that the baseband images in the chopped spectrum are generated by modulation of the pick-off signal $v_r$, with all harmonics of the frequency $f_c$. As shown in Appendix I, for demodulation by the kth harmonic of the chopping frequency $f_c$ such that $f_d = |f_o - (k)(f_c)|$, aliasing considerations will dictate constraints between the chopping frequency $f_c$ and the frequency $f_o$. Also shown in Appendix I is a table of selected values of the integers $I_1$ and $I_2$ for the counters 188 and 189 in FIG. 19 for the synchronous detection of an angular-rate signal from a quartz rate sensor by using a chopper in connection with a sigma-delta modulator as shown in FIG. 18.

As introduced in FIG. 18, an analog DSSC signal about a frequency $f_o$ is synchronously detected by a chopper used in connection with a sigma-delta modulator. In accordance with a further aspect of the present invention, the chopper is disposed in the feedback loop of the sigma-delta modulator. As shown in the alternative construction of FIG. 22, the sigma-delta modulator generally designated 230 includes a summing junction 231, the chopper 232, a noise-shaping lowpass filter 233, a one-bit analog-to-digital converter (ADC) 234, an exclusive-OR gate 235, and a one-bit digital-to-analog converter (DAC) 236. It should be recognized that the summer 231, the noise-shaping filter 233, the one-bit ADC 234, and the one-bit DAC 235 are conventional components of a sigma-delta modulator. The one-bit analog-to-digital converter 236, for example, is a latching comparator or a D flip-flop clocked at the sampling rate $f_s$.

The chopper 232 and the exclusive-OR gate 235 are both driven at the chopping frequency $f_c$. The one-bit ADC 234 of the sigma-delta modulator is clocked at the sampling rate $f_s$, that is much greater than the chopping frequency $f_c$.

Several advantages arise from placing the chopper 232 in the feedback loop of the sigma-delta modulator 230. The chopper removes DC offset of the analog components of the sigma-delta modulator. Moreover, the gain of the chopper 232 becomes invariant when it is placed in the feedback loop. For stability, when the chopper 232 is placed in the feedback loop, an exclusive-OR function 235 should be used in the feedback path so that there is always negative feedback around the loop.

In some applications, it might be more desirable to place the chopper outside of the feedback loop, at a point in the signal path before the summing node 231, as was shown in FIG. 18. It might be more desirable, for example, to place the chopper outside of the feedback loop as shown in FIG. 18 for use with an existing sigma-delta converter. To minimize the gain sensitivity to the imperfections of the chopper in a custom design, it is preferred to place the chopper in the feedback loop, as shown in FIG. 22.

Figure 23:
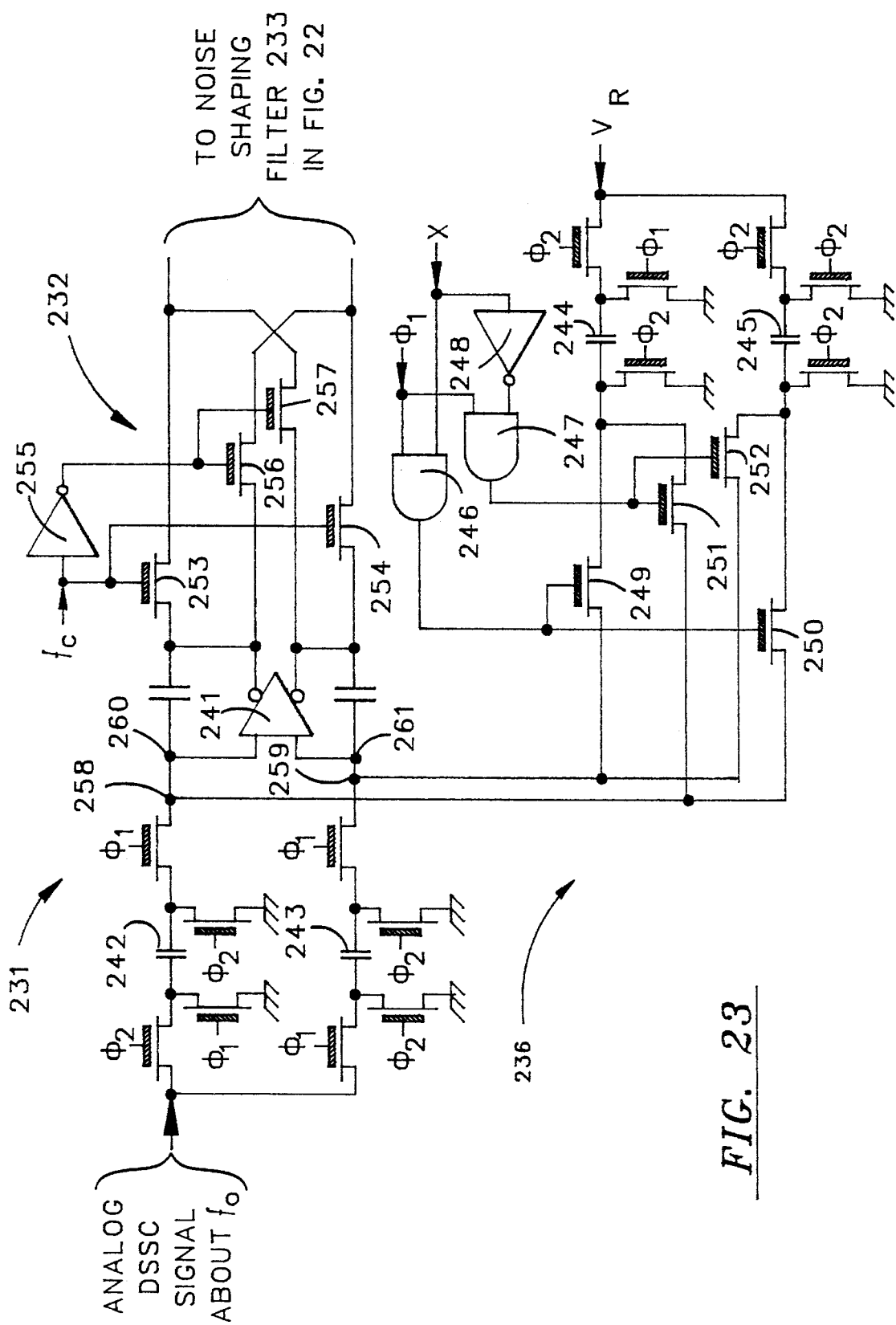
FIG. 23 is a schematic diagram showing in greater detail the summing node, chopper, and one-bit digital-to-analog converter in the sigma-delta modulator of FIG. 22.

Turning now to FIG. 23, there is shown a schematic diagram of the chopper 232, summing node 231, and one-bit DAC 236 as implemented in a differential architecture. The summing node 231 is the input to a differential integrator 241. The analog DSSC signal (such as the pick-off signal $v_r$ of the quartz rate sensor) is converted from a single-ended signal to a differential signal by switched capacitors 242, 243 that are switched at appropriate ones of the first $\phi_1$ and second $\phi_2$ phases of the sampling clock $f_s$. In a similar fashion, the one-bit DAC 236 has switched capacitors 244, 245 that convert a single-ended reference voltage $V_R$ to differential reference signals which are selectively applied to the inputs of the differential integrator 241 during the first phase $\phi_1$ of the sampling clock. The polarity of the reference voltage applied to the differential integrator 241 is selected in response to the signal (x) by AND gates 246, 247 and an inverter 248. The first AND gate 246 enables a first pair of MOS-FETS 249, 250 to apply a first polarity of the reference voltage $V_R$ to the differential integrator 241. The second AND gate 247 enables a second pair of MOS-FETS 251, 252 to apply the opposite polarity of the voltage reference $V_R$ to the differential integrator 241.

Figure 22:
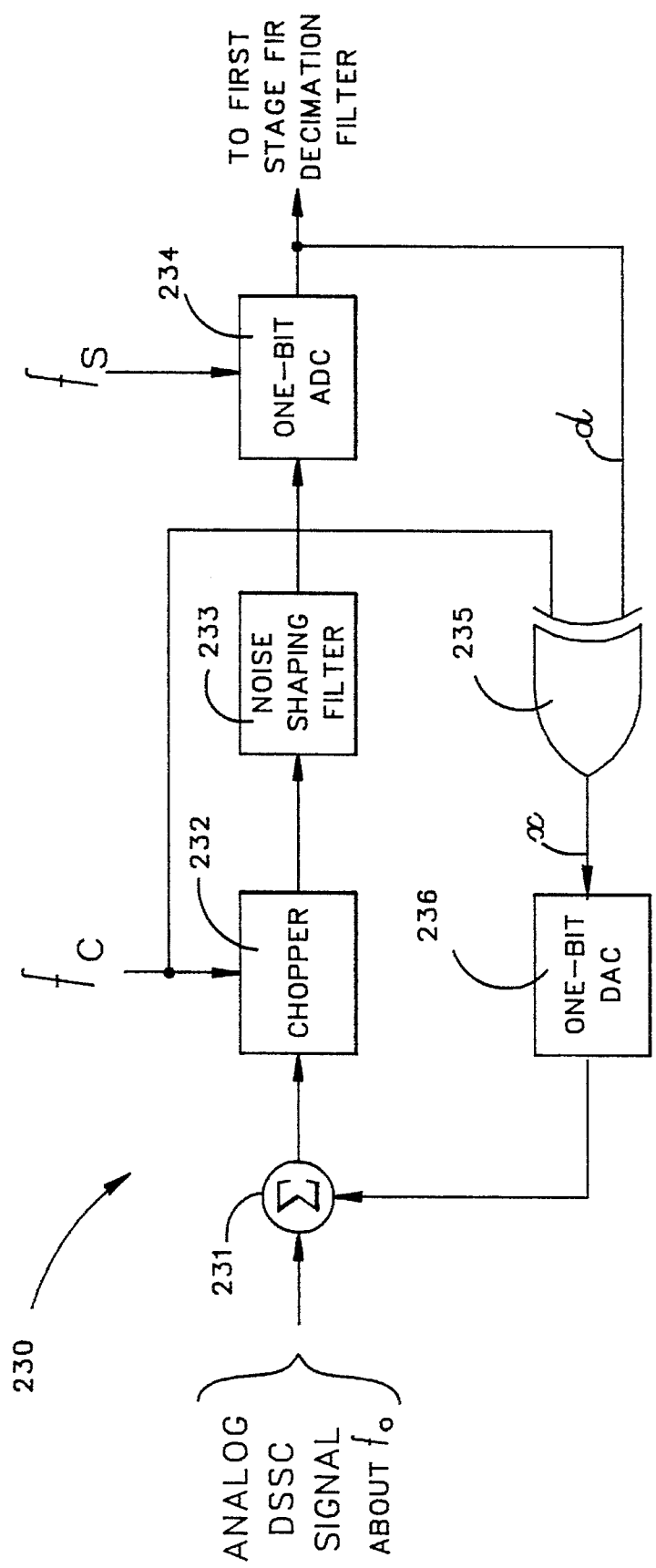
FIG. 22 is a block diagram showing an alternative way of connecting a chopper with a sigma-delta modulator such that the chopper is disposed inside the feedback loop of the sigma-delta modulator.

In the circuit of FIG. 23, the chopper 232 is placed between the output of the differential integrator 241 and the input to the noise-shaping filter (233 in FIG. 22). The chopper 232 includes a first pair of MOS-FETS 253, 254 which apply one polarity of output of the differential integrator 241 to the input of the noise-shaping filter, when the chopping signal $f_c$ is a logic high. When the chopping signal $f_c$ is a logic low, an inverter 255 enables a pair of MOS-FETS 256, 257 to apply an opposite polarity of output of the differential integrator 241 to the input of the noise-shaping filter (233 in FIG. 22).

It should be noted that the circuit of FIG. 23 could be modified so that the chopper 232 is placed before the differential integrator 241 instead of after the differential integrator. In other words, the chopper 232 could be placed in the feedback loop between the nodes 258, 259 and the inputs 260, 261 to the differential integrator 241. In FIG. 23, the chopper 232 is placed after the differential integrator 241, because the chopping frequency $f_c$ is very much less than the sampling rate $f_s$, and therefore it is desirable to place the chopper 232 after the differential integrator 241 so that frequencies in the analog DSSC signal that are much greater than the chopping frequency $f_c$ are suppressed by the integrator 241 before modulation by the chopping frequency $f_c$. These high-frequency components in the analog DSSC signal are undesirable, because they become modulated down to baseband by harmonics of the chopping frequency $f_c$.

Figure 24:
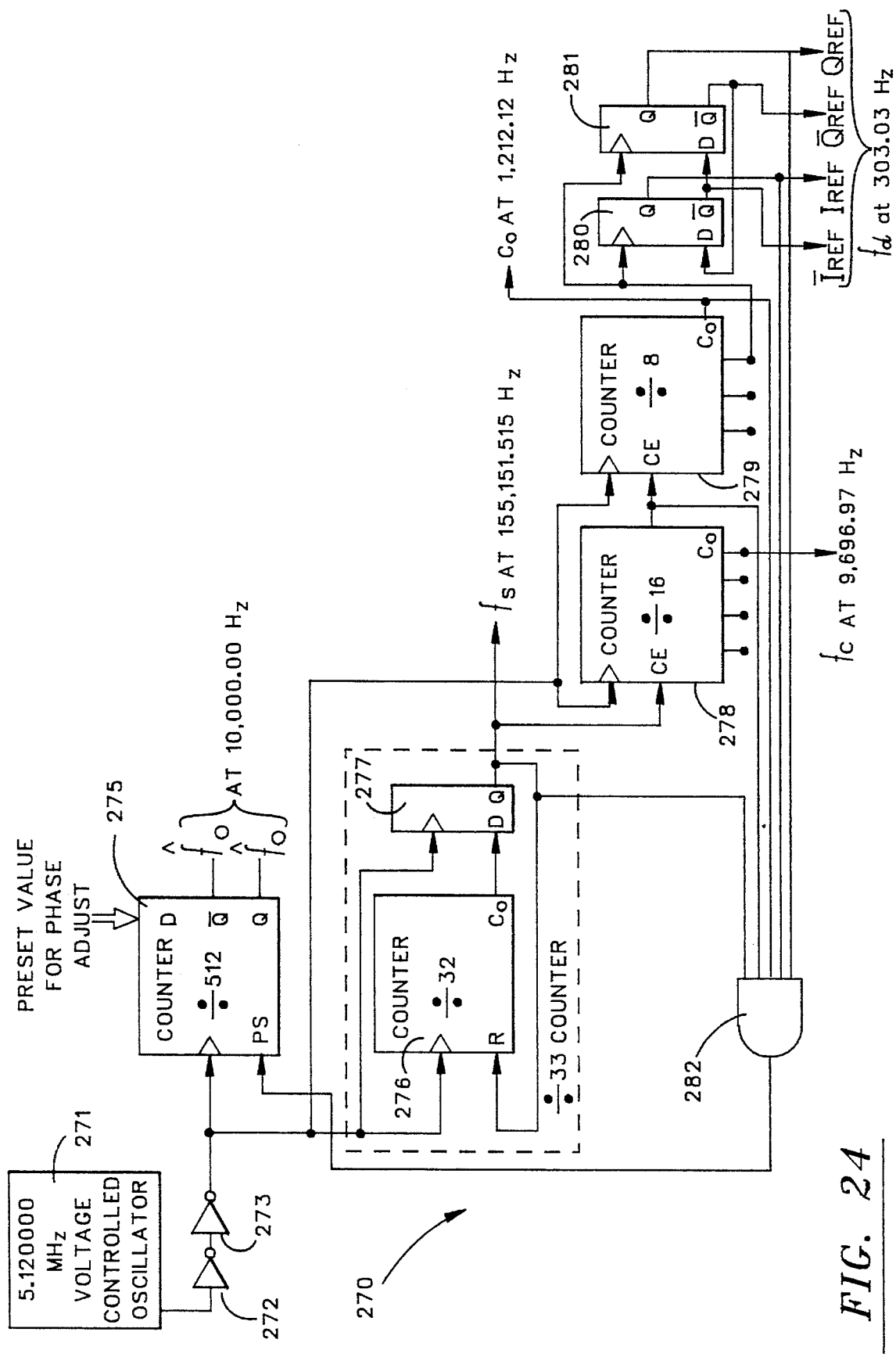
FIG. 24 is a schematic diagram of a preferred clock generator circuit for generating clocking signals in the system of FIG. 18 when the chopper is incorporated into the feedback loop of the sigma-delta modulator shown in FIG. 22.

Turning now to FIG. 24, there is shown a schematic diagram of a set of counters 270 for a clock generator circuit similar to the clock generator circuit 174 of FIGS. 18 and 19. The counters 270, however, are interconnected in a manner somewhat different from the circuit shown in FIG. 19 in order to take advantage of certain simplifications that result for the specific values chosen for $I_1$ and $I_2$. In addition, the resetting and presetting of the counters is done in a somewhat different way so that the resetting is done automatically and on a periodic basis to insure that any loss of synchronization between the counters will be corrected within a very short period of time.

The counters 270 in FIG. 24 correspond to the solution $I=3$, $I_1=16$, and $I_2=512$ in the solution matrix of Appendix I. This solution is particularly advantageous because conventional binary counters can be used in connection with just a few other logic elements. As shown in FIG. 24, a voltage-controlled oscillator 271 generates a signal at about 5.120000 MHz. The output of the oscillator is quantized to binary logic levels by a string of inverters 272, 273. The output of the string of inverters 272, 273 provides a binary clocking signal.

A nine-stage synchronous binary counter 275 is clocked by the inverter 273 to divide the oscillator frequency by 512 to generate $f_o$ at 10,000.00 Hz. A five-stage synchronous binary counter 276 is clocked by the inverter 273 and generates a carry-out ($C_o$) that is delayed by one sample clock cycle in a D flip-flop 277 and fed back to a reset input (R) of the counter. Therefore, the output of the D flip-flop 277 provides pulses at the sampling rate $f_s$, of 155,151.515 Hz. This is the frequency $f_s$, of the $\phi_1$ and $\phi_2$ sampling clocks used in FIG. 23. The output of the D flip-flop 277 is connected to a clock enable (CE) or carry-in input of a four-stage synchronous binary counter 278. The most significant bit of the value of the counter 278 provides the chopping signal $f_c$ at 9,696.97 Hz. The carry-out of the counter 278 is connected to the carry-in of a three-stage synchronous binary counter 279. The most significant bit of the value of the counter 279 is at 1,212.12 Hz, which is four times the difference frequency $f_d$=303.03 Hz, and, for example, is the word rate of the words (w) from the first-stage FIR digital decimation filter 172 in FIG. 18. The most significant bit of the value of the counter clocks a pair of D flip-flops 280 and 281 that are connected as a divide-by-four shift counter. The D flip-flop 280 provides the in-phase demodulator reference signal at an intermediate frequency $f_d$ of 303.03 Hz, and the D flip-flop 281 provides the quadrature-phase demodulator reference signal at the same intermediate frequency $f_d$.

One curious aspect of the down-conversion technique is that the counter 275 providing $f_o$ must remain in a particular phase relationship with respect to the counters and flip-flops 276, 277, 278, 279, 280 and 281. If the value in the counter 275 is instantaneously changed by 256 counts, for example, the angular-rate signal $\Omega$ detected by the circuit of FIG. 14 would switch in polarity. To maintain a fixed phase relationship, when the counters and flip-flops 276, 277, 278, 279, 280 and 281 simultaneously reach their zero states, the counter 275 is preset by an AND gate 282 in order to re-load the counter 275 with a preset value specifying a phase adjustment value. The phase adjustment value, for example, is read from a non-volatile calibration ROM (not shown) that is programmed during calibration of the quartz rate sensor of FIG. 4.

Figure 25:
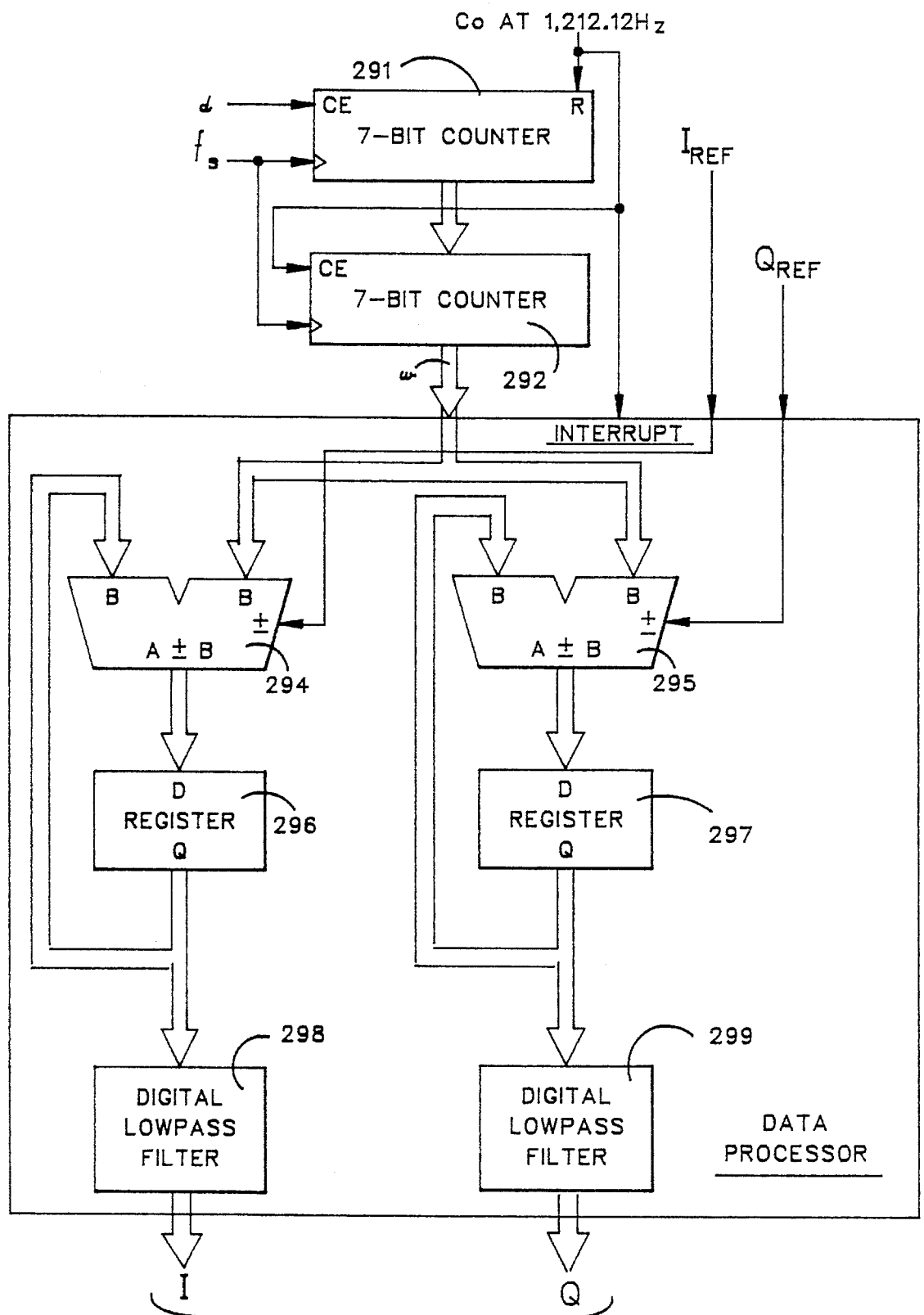
FIG. 25 is a schematic diagram of digital signal processing circuits that could be used in connection with the clock generator circuit of FIG. 24.

Turning now to FIG. 25, there is shown a schematic diagram of digital signal processing circuits that could be used in connection with the clock generator circuits of FIG. 24 in order to perform the functions of the first stage FIR decimation filter 172, the complex demodulator 173, the in-phase channel second-stage decimation filter 175, and the quadrature-phase second-stage decimation filter 176. As shown in FIG. 25, a 7-bit binary counter 291 is clocked at the sampling rate $f_s$, of 155,155.515 Hz, and has a clock-enable or carry-in responsive to the data bits (d) from the sigma-delta modulator (171 in FIG. 18). The counter is synchronously reset by the carry-out ($C_o$) at 1,212.12 Hz from the counter 279 in FIG. 24. The value of the counter is strobed into a 7-bit register just before the counter is reset by the carry-out $C_o$. Therefore the counter 291 and the register 292 function as the first-stage FIR decimation filter by converting the data bits (d) at the sampling rate $f_s$, to 7-bit data words at a 1,212.12 Hz word rate.

As shown in FIG. 25, a data processor 293 is programmed to perform the digital signal processing functions of the complex demodulator 173, the in-phase channel second-stage decimation filter 175, and the quadrature-phase channel second-stage decimation filter 176. The data processor 293, for example, could be a 16-bit microprocessor. The complex demodulator function is merged with the second-stage decimation filter function; the demodulator reference signals ($I_{REF}$ and $Q_{REF}$ from FIG. 24) control respective arithmetic units 294 and 295 to either add or subtract the data words (w) from accumulated values accumulated in respective registers 296 and 297. Groups of four successive data words (w) are accumulated to provide 9-bit values at a 303.03 Hz rate. These 9-bit values are substantially independent, and therefore represent analog signals having a bandwidth of about 151 Hz. These 9-bit values can therefore be further band-limited to about 50 Hz by digital low-pass filters 298, 299 with a further increase in digital resolution, for example, to provide 11-bit digital words at the 303.03 Hz rate. The data processor 293 is programmed, for example, with the following interrupt routine:

```
*** INTERRUPT ROUTINE AT 1212.12 HZ ***
READ W
READ I_DEMOD_REF
READ Q_DEMOD_REF
IF (I_DEMOD_REF = 0) THEN REG_A ← REG_A + W
    ELSE REG_A ← REG_A - W
IF (Q_DEMOD_REF = 0) THEN REG_B ← REG_B + W
    ELSE REG_B ← REG_B - W
IF (I_DEMOD_REF = 0 OR Q_DEMOD_REF = 0) THEN RETURN
FOR J =1 TO 5
    ITEMP(J) ← ITEMP (J+1)
    QTEMP(j) ← QTEMP (J+1)
    END
ITEMP(6) ← REG_A
QTEMP(6) ← REG_B
CLEAR REG_A
CLEAR REG_B
CLEAR INTERRUPT MASK
I= 0.25*ITEMP(1)+0.75*ITEMP(2)+ITEMP(3)+
    ITEMP(4)+0.75*ITEMP(5)+0.25*ITEMP(6)
Q= 0.25*QTEMP(1)+0.75*QTEMP(2)+QTEMP(3)+
    QTEMP(4)+0.75*QTEMP(5)+0.25*QTEMP(6)
OUTPUT I
OUTPUT Q
```

RETURN

This example illustrates that 11-bit resolution could be obtained very easily for an angular-rate signal from the quartz rate sensor of FIG. 4 by using a relatively low sampling rate $f_s$ of about 155 kHz and very simple digital filtering. Of course, a higher sampling rate or more complex digital filtering could be used to obtain increased resolution. In any case, the delta-sigma modulator ensures that the analog-to digital conversion is monotonic and highly linear.

An example of more complex digital filtering would be a first-stage FIR digital decimation filter (172 in FIG. 18) that is a bandpass filter about the intermediate frequency $f_d$. For example, in the first-stage FIR digital decimation filter, each output word ($W_i$) could be computed as:

$$W_{i=j/D} = \sum_{k=-n}^{k=+n} d_{j+k} a_{|k|}$$

where D is the decimation ratio of the sampling rate $f_s$ to the word rate, $a_{|k|}$ is a vector of n+1 FIR filter coefficients, and $d_{j+k}$ are the bits from the sigma-delta modulator (171 in FIG. 18) and assumed to have values of +1 or −1. The FIR filter coefficients are determined, for example, as a function of n, the normalized center frequency $f_d/f_s$, and the normalized bandwidth $2\Delta f/f_s$, by the well-known Remez exchange algorithm. The Remez exchange algorithm is described, for example, in Chi-Tsong Chen, *One-Dimensional Digital Signal Processing*, Marcel Dekker, Inc., New York, N.Y., 1979, pp. 206–215; and Rabiner and Gold, *Theory and Application of Digital Signal Processing*, Prentice-Hall, Inc., Englewood Cliffs, N.J., 1975, pp. 136–140, 194–204; which are incorporated herein by reference. Rabiner & Gold include a listing of a FORTRAN program that computes the FIR filter coefficients according to the Remez Exchange Algorithm.

When the first-stage FIR digital decimation filter (172 in FIG. 18) is a highly-selective bandpass filter, it would not be necessary to use the second-stage decimation filters (175 and 176 in FIG. 18). In this case, the in-phase data words I could be demodulated by clocking them directly out of the complex demodulator (173 in FIG. 18) at positive transitions of a data clock at twice the intermediate frequency $f_d$, and the quadrature-phase data words Q could be demodulated by clocking them directly out of the complex demodulator at negative transitions of the data clock at twice the intermediate frequency $f_d$. The data clock at twice the intermediate frequency could be produced as the exclusive-OR of the $I_{REF}$ and the $Q_{REF}$ signals from the Q outputs of the D flip-flops 280 and 281 in FIG. 24.

Figure 26:
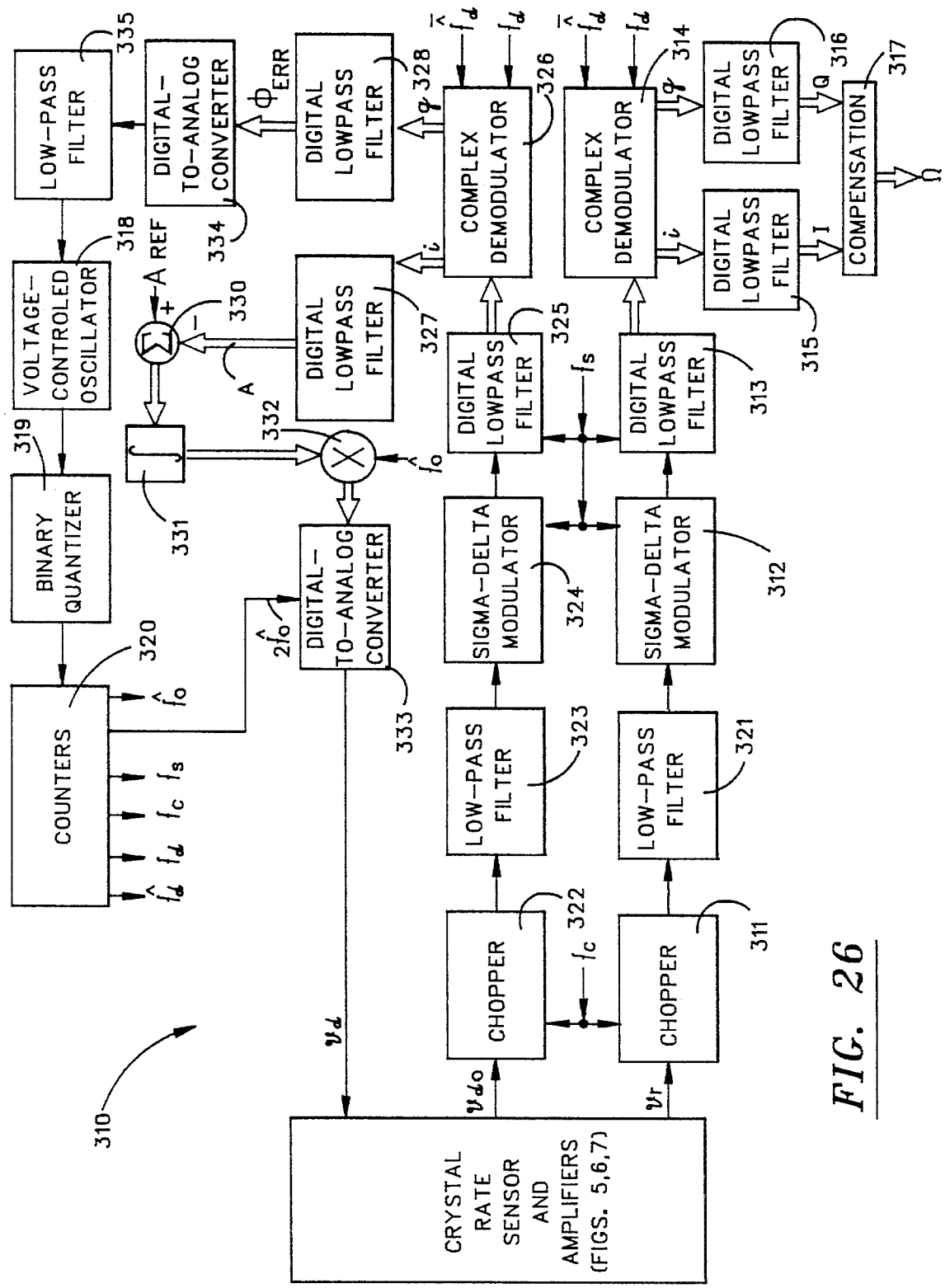
FIG. 26 shows an alternative crystal rate sensor circuit that uses a first chopper and sigma-delta modulator for detecting an angular-rate signal, and a second chopper and sigma-delta modulator for detecting an amplitude signal and a phase error signal used for driving the crystal rate sensor.

Turning now to FIG. 26, there is shown an alternative circuit 310 using a first chopper 311 and a first sigma-delta modulator 312 for detecting an angular-rate signal from a crystal rate sensor, and a second chopper 322 and a sigma-delta modulator 324 for detecting an amplitude signal (A) and a phase error signal ($\phi_{ERR}$) used for driving the crystal rate sensor. The first chopper 311, the first sigma-delta modulator 312, a digital low-pass filter 313, a complex demodulator 314, a digital low-pass filter 315, a digital low-pass filter 316, and compensation 317 are used for detecting the angular rate signal $\Omega$ in the fashion described above. These circuits use a chopping signal $f_c$, a sampling signal $f_s$, and an intermediate frequency signal $f_d$ generated by a voltage-controlled oscillator 318, a binary quantizer 319, and a set of counters 320, as described above. In addition, a lowpass filter 321 is disposed between the chopper 311 and the sigma-delta modulator 312.

In the circuit 310 of FIG. 26, there could be some variable phase shift and amplitude drift due to the chopper 311 and the lowpass filter 321. To compensate for this phase shift and amplitude drift, the amplitude signal (A) and the phase error signal ($\phi_{ERR}$) is detected from the signal $v_{do}$ by using the second chopper 322, a lowpass filter 323, the second sigma-delta converter 324, a digital lowpass filter 325, and a complex demodulator 326 that are similar in construction to the first chopper 311, lowpass filter 321, first sigma-delta converter 312, digital lowpass filter 313, and complex demodulator 314. The in-phase product (i) from the complex demodulator 326 indicates the amplitude of the signal $v_{do}$, and the quadrature-phase product (q) from the complex demodulator 326 indicates the phase of the signal $v_{do}$ relative to the phase of the voltage-controlled oscillator 318.

A digital lowpass filter 327 filters the in-phase product (i) from the complex demodulator 326 to produce the amplitude signal (A). This digital lowpass filter 327 functions as an amplitude detection filter for an automatic gain control loop. The automatic gain control loop further includes a subtractor 330, a digital integrator 331, a digital modulator 332, and a digital-to-analog converter 333. The modulator 332 selectively complements the number from the integrator 331 in response to the binary value of the signal at the frequency of oscillation $f_o$. The digital-to-analog converter 333 is clocked at a rate twice that of $f_o$. A clocking signal at twice the rate of $f_o$ can be obtained from a counter similar to the counter 275 in FIG. 24.

The digital low-pass filter 328 that produces the phase error signal $\phi_{ERR}$ performs the function of an integrating lead-lag loop filter for the voltage-controlled oscillator 318. A digital-to-analog converter 334 converts the phase error signal $\phi_{ERR}$ to an analog signal, and a low-pass filter 335 passes the analog phase error signal to the frequency-control input of the voltage-controlled oscillator 318.

In view of the above, there has been described a method and apparatus for using a chopper in connection with a delta-sigma converter for down-conversion or synchronous detection and digitizing of a detected signal. Although the method and apparatus have been described with reference to a quartz angular-rate sensor, they would be useful for other applications where down-conversion or synchronous detection is needed. Therefore, the method and apparatus could be useful for synchronous detection of modulated signals from other kinds of sensors, such as fluxgate magnetometers and position sensors employing variable-phase transformers. The method and apparatus could also be used for down-conversion and synchronous detection of digital radio signals that employ linear modulation, such as phase-shift keying.

APPENDIX I

MATHCAD (Trademark) PROGRAM
QRSJCPSMOD.MCD

This program determines allowable regions of operation for the Pinson modulator using choppers (rather than linear multipliers) as the converter at the input to the 1-bit modulator and as the complex demodulator within the decimator, with no analog antialiasing filter between the input chopper and the 1-bit modulator. This method is alias free.

USER SETUP

SWITCH := 0 ... SWITCH = 0 for right-side-up spectra,
SWITCH = 1 for inverted spectra (and not many good solutions!).

$f_0 := 10^4$ ... input carrier frequency
$\delta f := 150$ ... input single-sided signal bandwidth
$fADC_{max} := 650$ ... maximum signal frequency into the 1-bit modulator
$fs_{max} := 5 \cdot 10^5$ ... maximum sampling frequency of the 1-bit modulator
$fs_{min} := 1 \cdot 10^5$ ... minimum sampling frequency of the 1-bit modulator $$k_{max} := \text{floor}\left[\frac{f_0 - (-1)^{SWITCH} \cdot \delta f}{4 \cdot \delta f}\right]$$

... if we try to squeeze in more than kmax images, aliasing will occur.
If we try to squeeze in more than one image, the number of valid solutions is small.
Now we are free to select an allowable value of k. the kth spectral image is adjacent to zero frequency.
Second warning: don't expect many good answers for K > 1.

$k_{max} = 16$ $k_{max}$

After setup, hit ESC, then type PROCESS; next type ESC and GOTO 130 (to see if you have any valid solutions!) If so, hit CTRL-END and see what you have.

COMPUTE THE ALLOWABLE RANGES OF THE CONSEQUENT DESIGN PARAMETERS $$fc_{max} := \frac{f_0 - \delta f}{k - SWITCH \cdot .5}$$

$fc_{max} = 9850$ ... maximum chopper frequency that can be used without danger of introducing aliasing at the bottom of the spectral image.

$$fc_{min} := \frac{f_0 + \delta f}{k + (1 - SWITCH) \cdot .5}$$

$fc_{min} = 6766.666667$

... minimum chopper frequency that can be used without danger of introducing aliasing at the top of the spectral image.

$fd_{max} := fADC_{max} - \delta f$ $fd_{max} = 500$ ... maximum demodulation frequency that can be used due to the input-signal-bandwidth limitations on the 1-bit modulator.

$fd_{min} := 2 \cdot \delta f$
$fd_{min} = 300$ ... minimum demodulation frequency that can be used to avoid aliasing that may occur following the demodulator.

SET UP THE INDICES AND THE I1 AND I2 PARAMETER RANGES

The ratio of the sampling frequency to the chopping frequency must be some integer, I1. The purpose of restricting I1 to integer values is to ensure that the spectrum at multiples of the sampling frequency is an exact replica of the spectrum at zero frequency, thereby eliminating the danger of aliasing due to the convolution of the baseband spectrum with integer multiples of fs. Using similar reasoning, the ratio of the sampling frequency to the demod frequency must be an integer, I2 (which, this time, must be a power of 2). Now we determine their ranges, and set up indices that span the ranges:

$$I1_{max} := \text{ceil}\left[\frac{fs_{max}}{fc_{min}}\right] \qquad I1_{max} = 74$$

$$I1_{min} := \text{floor}\left[\frac{fs_{min}}{fc_{max}}\right] \qquad I1_{min} = 10$$

$$I5_{max} := \text{ceil}\left[\frac{\log\left[\frac{fs_{max}}{fd_{min}}\right]}{\log(2)}\right] - 1 \qquad I5_{max} = 10$$

$$I5_{min} := \text{floor}\left[\frac{\log\left[\frac{fs_{min}}{fd_{max}}\right]}{\log(2)}\right] - 1 \qquad I5_{min} = 6$$

$i_{max} := I1_{max} - I1_{min} \qquad i_{max} = 64$ $j_{max} := I5_{max} - I5_{min} \qquad j_{max} = 4$ $i := 0 \ldots i_{max} \qquad j := 0 \ldots j_{max}$

APPENDIX I-continued $I1_i := i + I1_{min}$
$I5_j := j + I5_{min}$ $2_j := 2^{I5_j + 1}$

ESTABLISH CRITICAL FREQUENCIES AS FUNCTIONS OF I1 AND I2

$FS_{i,j} := f_0 \cdot \dfrac{I1_i \cdot I2_j}{I2_j + (-1)^{SWITCH} \cdot I1_i}$ ... the machinery for computing the sampling frequency ...

$fc_{i,j} := \dfrac{fs_{i,j}}{I1_i}$ ... and the chopping frequency ...

$fd_{i,j} := \dfrac{fs_{i,j}}{I2_j}$ ... and the demod frequency.

Now we determine the values of the indices which satisfy the performance constraints ...
$LL_{i,j} := [fc_{i,j} > fc_{min}] \cdot [fd_{max} > fd_{i,j}] \cdot [fd_{i,j} > fd_{min}]$
$M_{i,j} := [fs_{max} > fs_{i,j}] \cdot [fs_{i,j} > fd_{min}] \cdot [fc_{max} > fc_{i,j}] \cdot LL_{i,j}$ ... and we can determine the number of solutions that exist:
$u_j := \Sigma[M^{<j>}]$    SOLUTIONS $:= \Sigma u$    SOLUTIONS $= 35$ The matrix M (of indices i and j) has a "1" wherever an allowable solution exists, and a "0" where such a solution lacking. We will code those allowable values of i and j that give good solutions into vector "mm" ("no solution" appears as a "0"), sort those solutions into vector "ms", discard all invalid solutions (i.e., the "0's"), to leave us with vector "sm", which we sort a second time to finally obtain vector "s."

$mm_{i+j(i_{max}+1)} := M_{i,j} \cdot [i + j \cdot [i_{max} + 1]]$    $1 := 0 \ldots \Sigma u - 1$
$ms := -sort(-mm)$    $sm_1 := ms_1$    $s := sort(sm)$    $11_1 := 1$ Now we decode "s" to extract the row (i = n) and column (j = m) locations of "M" that contain the valid solutions.

$m := \overline{mod\,[s, i_{max} + 1]}$ $n := \overline{floor\left[\dfrac{s}{i_{max} + 1}\right]}$ ... and the corresponding valid values of I1 and I2 are:

$I_1 := I1_{min} + m$    $I_5 := I5_{min} + n$ $I_2 := \overline{[2^{I_5 + 1}]}$ ... and the frequencies fs, fd, and fc are:

$f_s := f_0 \cdot \overline{\dfrac{[I_1 \cdot I_2]}{I_2 + (-1)^{SWITCH} \cdot I_1}}$    $f_c := \overline{\left[\dfrac{f_s}{I_1}\right]}$    $f_d := \overline{\left[\dfrac{f_s}{I_2}\right]}$

COMPUTE OTHER USEFUL PARAMETERS $D := I_5 - 1$    ... the number of stages of decimation between the 1-bit modulator and the demodulator $T := \left[floor\left[\dfrac{\log\left[\dfrac{f_s}{2 \cdot \delta f}\right]}{\log(2)}\right]\right]$    ... the maximum number of decimation stages that Nyquist would permit, assuming perfect filtering.

APPENDIX I-continued $$R := \text{floor}\left[\left[\frac{\log\left[\frac{f_s}{3 \cdot \delta f}\right]}{\log(2)}\right]\right]$$

... a more reasonable cut at the maximum number of decimation stages.

$$F := \left[2 \cdot f_s \cdot \frac{2^{-R}}{\delta f}\right]$$

... the maximum ratio of sampling frequency to passband edge of a half-band decimation filter to meet these objectives. Smaller values provide superior noise filtering, but are the more costly.

... maximum group delay in seconds.

$$\tau := \left[\frac{12}{f_s} \cdot [2^R - 1]\right]$$

GENERATE A MATRIX TO DISPLAY THE RESULTS $Q^{<0>} := I1$   $Q^{<3>} := f_s$   $Q^{<6>} := D$   $Q^{<9>} := F$
$Q^{<1>} := I1$   $Q^{<4>} := f_c$   $Q^{<7>} := T$   $Q^{<10>} := \tau$
$Q^{<2>} := I2$   $Q^{<5>} := f_d$   $Q^{<8>} := R$

THE SOLUTION MATRIX

|    | $I_1$ | $I_2$ | $f_s$ | $f_c$ | $f_d$ | D | T | R | F | $\tau$ |
|----|-----|------|------------|----------|---------|---|----|----|--------|-------|
| 0  | 11  | 256  | 105468.165 | 9588.015 | 411.985 | 6 | 8  | 7  | 10.986 | 0.014 |
| 1  | 12  | 256  | 114626.966 | 9552.239 | 447.761 | 6 | 8  | 7  | 11.94  | 0.013 |
| 2  | 13  | 256  | 123717.472 | 9516.729 | 483.271 | 6 | 8  | 8  | 6.444  | 0.025 |
| 3  | 16  | 512  | 155151.515 | 9696.97  | 303.03  | 7 | 9  | 8  | 8.081  | 0.02  |
| 4  | 17  | 512  | 164536.862 | 9679.639 | 321.361 | 7 | 9  | 8  | 8.57   | 0.019 |
| 5  | 18  | 512  | 173886.792 | 9660.377 | 339.623 | 7 | 9  | 8  | 9.057  | 0.018 |
| 6  | 19  | 512  | 183201.507 | 9642.185 | 357.815 | 7 | 9  | 8  | 9.542  | 0.017 |
| 7  | 20  | 512  | 192481.203 | 9624.06  | 375.94  | 7 | 9  | 8  | 10.025 | 0.016 |
| 8  | 21  | 512  | 201726.079 | 9606.004 | 393.996 | 7 | 9  | 8  | 10.507 | 0.015 |
| 9  | 22  | 512  | 210936.33  | 9588.015 | 411.985 | 7 | 9  | 8  | 10.986 | 0.015 |
| 10 | 23  | 512  | 220112.15  | 9570.093 | 429.907 | 7 | 9  | 8  | 11.464 | 0.014 |
| 11 | 24  | 512  | 229253.731 | 9552.239 | 447.761 | 7 | 9  | 8  | 11.94  | 0.013 |
| 12 | 25  | 512  | 238361.266 | 9534.451 | 465.549 | 7 | 9  | 9  | 6.207  | 0.026 |
| 13 | 26  | 512  | 247434.944 | 9516.729 | 483.271 | 7 | 9  | 9  | 6.444  | 0.025 |
| 14 | 32  | 1024 | 310303.03  | 9696.97  | 303.03  | 8 | 10 | 9  | 8.081  | 0.02  |
| 15 | 33  | 1024 | 319697.256 | 9687.796 | 312.204 | 8 | 10 | 9  | 8.325  | 0.019 |
| 16 | 34  | 1024 | 329073.724 | 9678.639 | 321.361 | 8 | 10 | 9  | 8.57   | 0.019 |
| 17 | 35  | 1024 | 338432.483 | 9669.5   | 330.5   | 8 | 10 | 9  | 8.813  | 0.018 |
| 18 | 36  | 1024 | 347773.585 | 9660.377 | 339.623 | 8 | 10 | 9  | 9.057  | 0.018 |
| 19 | 37  | 1024 | 357097.078 | 9651.272 | 348.728 | 8 | 10 | 9  | 9.299  | 0.017 |
| 20 | 38  | 1024 | 366403.013 | 9642.185 | 357.815 | 8 | 10 | 9  | 9.542  | 0.017 |
| 21 | 39  | 1024 | 375691.439 | 9633.114 | 366.886 | 8 | 10 | 9  | 9.784  | 0.016 |
| 22 | 40  | 1024 | 384962.406 | 9624.06  | 375.94  | 8 | 10 | 9  | 10.025 | 0.016 |
| 23 | 41  | 1024 | 394215.962 | 9615.023 | 394.977 | 8 | 10 | 9  | 10.266 | 0.016 |
| 24 | 42  | 1024 | 403452.158 | 9606.004 | 393.996 | 8 | 10 | 9  | 10.507 | 0.015 |
| 25 | 43  | 1024 | 412671.004 | 9597.001 | 402.999 | 8 | 10 | 9  | 10.747 | 0.015 |
| 26 | 44  | 1024 | 421872.659 | 9588.015 | 411.985 | 8 | 10 | 9  | 10.986 | 0.015 |
| 27 | 45  | 1024 | 431057.063 | 9579.046 | 420.954 | 8 | 10 | 9  | 11.225 | 0.014 |
| 28 | 46  | 1024 | 440224.299 | 9570.093 | 429.907 | 8 | 10 | 9  | 11.464 | 0.014 |
| 29 | 47  | 1024 | 449374.416 | 9561.158 | 438.842 | 8 | 10 | 9  | 11.702 | 0.014 |
| 30 | 48  | 1024 | 458507.463 | 9552.239 | 447.761 | 8 | 10 | 9  | 11.94  | 0.013 |
| 31 | 49  | 1024 | 467623.486 | 9543.336 | 456.664 | 8 | 10 | 10 | 6.089  | 0.026 |
| 32 | 50  | 1024 | 476722.533 | 9534.451 | 465.549 | 8 | 10 | 10 | 6.207  | 0.026 |
| 33 | 51  | 1024 | 485804.651 | 9525.581 | 474.419 | 8 | 10 | 10 | 6.326  | 0.025 |
| 34 | 52  | 1024 | 494869.888 | 9516.729 | 483.271 | 8 | 10 | 10 | 6.444  | 0.025 |

What is claimed is:

1. A method of demodulating an analog signal including information modulated by a carrier, said carrier having a carrier frequency $f_o$, said method comprising the steps of:

a) generating a sampling signal having a sampling frequency $f_s$, a chopping signal having a chopping frequency $f_c$, and an intermediate frequency signal at an intermediate frequency $f_d$ that is less than the chopping frequency and is the magnitude of the difference between the carrier frequency $f_o$ and a harmonic of the chopping frequency $f_c$, said frequencies being related by predetermined integers $I_1$, $I_2$, $I_3$, and $I_4$ such that $f_o = (I_3/I_4)f_s$ $f_c = f_s/I_1$ and $f_d = f_s/I_2$;

b) chopping said analog signal with said chopping signal to produce a chopped analog signal;

c) digitizing said chopped analog signal with a sigma-delta modulator including an analog-to-digital converter clocked by said sampling signal and receiving said chopped analog signal to produce digital samples at said sampling frequency;

d) filtering said digital samples in a digital filter to produce data words; and e) demodulating said data words by said intermediate frequency signal to produce a detected information signal.

2. The method as claimed in claim 1, wherein said step a) of generating includes phase-locking an oscillator to said carrier to generate said sampling signal, and clocking digital counters with said sampling signal to divide said sampling frequency by said integers $I_1$ and $I_2$ in order to generate said chopping signal and said intermediate frequency signal.

3. The method as claimed in claim 1, wherein said intermediate frequency $f_d$ is the magnitude of the difference between the carrier frequency $f_o$ and the chopping frequency $f_c$.

4. The method as claimed in claim 1, wherein $I_1I_2/(I_2+I_1)$ is an integer.

5. The method as claimed in claim 1, wherein said analog-to-digital converter produces one-bit digital samples at said sampling frequency.

6. The method as claimed in claim 1, wherein said analog signal is chopped within a feedback loop of said sigma-delta modulator.

7. The method as claimed in claim 6, wherein said digital filter is a decimating filter that produces data words at a word rate that is a sub-multiple of said sampling rate.

8. The method as claimed in claim 7, wherein said chopping frequency is a harmonic of said word rate.

9. The method as claimed in claim 1, wherein said intermediate frequency signal is a square wave, and said step e) of demodulating said data words by said intermediate frequency signal is performed by selectively complementing said data words.

10. The method as claimed in claim 1, further including the steps of generating a quadrature-phase signal at said intermediate frequency and in phase-quadrature with respect to said intermediate frequency signal, and modulating said data words by said quadrature-phase signal to produce a quadrature detected signal.

11. The method as claimed in claim 10, further comprising the seep of making a phase adjustment of phase of said intermediate frequency signal with respect to phase of said carrier in order to reduce an amount of said information that appears in said quadrature detected signal.

12. The method as claimed in claim 1, wherein said analog signal is a double-sideband suppressed-carrier signal.

13. The method as claimed in claim 12, wherein said analog signal represents vibrations of pick-up tines of a quartz angular-rate sensor, and said digital values indicate a time rate of change of angular position of said quartz angular-rate sensor.

14. A method of demodulating an analog signal, said method including the steps of:

a) summing said analog signal with an analog feedback signal to produce an error signal;

b) chopping said error signal in response to a chopping signal to produce a chopped signal;

c) low-pass filtering said chopped signal to produce a filtered signal;

d) converting said filtered signal to a series of binary samples at a periodic sampling rate;

e) producing a digital feedback signal that is an exclusive-OR function of said chopping signal and said series of binary samples; and f) producing said analog feedback signal by digital-to-analog conversion of said digital feedback signal.

15. The method as claimed in claim 14, wherein said chopping signal is periodic and has a frequency that is a sub-multiple of said sapling rate.

16. The method as claimed in claim 14, wherein said analog signal includes information modulated by a carrier, and said method further includes phase-locking an oscillator to said carrier, said oscillator having a frequency of oscillation that is a harmonic of said sampling rate, and dividing said frequency of oscillation to produce said chopping signal.

17. The method as claimed in claim 16, further comprising the step of digitally filtering said series of binary samples to produce a series of digital words at a word rate that is a sub-multiple of said sampling rate.

18. The method as claimed in claim 17, wherein said chopping frequency is a harmonic of said word rate.

19. The method as claimed in claim 17, further comprising the step of dividing said frequency of oscillation to produce a binary intermediate frequency signal at an intermediate frequency that is a sub-multiple of said word rate, and selectively complementing said digital words in response to said binary intermediate frequency signal.

20. The method as claimed in claim 17, further comprising the step of dividing said frequency of oscillation to produce an intermediate frequency signal at an intermediate frequency ($f_d$), and demodulating said digital words by said intermediate frequency signal to produce a detected information signal, wherein said intermediate frequency ($f_d$) is the magnitude of the difference between the carrier frequency ($f_o$) and the chopping frequency ($f_c$).

21. A sigma-delta heterodyne detection circuit for demodulating an analog signal, said circuit comprising, in combination:

a) a summing node for summing said analog signal with an analog feedback signal to produce an error signal;

b) a chopper having a control input responsive to a chopping signal at a chopping frequency and being connected to said summing node for receiving said error signal and chopping said error signal to produce a chopped signal;

c) a noise-shaping lowpass filter connected to said chopper for filtering said chopped signal to produce a filtered chopped signal;

f) a one-bit analog-to-digital converter having a control input responsive to a sampling signal at a sampling rate and being connected to said noise-shaping filter for converting said filtered chopped signal to a series of binary samples at said sampling rate;

g) an exclusive-OR gate connected to said one-bit analog-to-digital converter and said chopper for producing a digital feedback signal that is an exclusive-OR function of said chopping signal and said series of binary samples;

h) a one-bit digital-to-analog converter connected to said exclusive-OR gate and said summing node for converting said digital feedback signal to said analog feedback signal; and i) a digital decimation filter connected to said one-bit analog-to-digital converter for filtering said series of binary samples to produce a series of digital words at a word rate that is less than said sampling rate.

22. The circuit as claimed in claim 21, further comprising a clock generator circuit including a phase-locked loop having an oscillator connected to said one-bit analog-to-digital converter for generating said sampling signal in phase-lock with a carrier of said analog signal, and a digital counter connected to said oscillator and said chopper and said exclusive-OR gate for generating said chopping signal at a chopping frequency that is a sub-multiple of said sampling frequency.

23. The circuit as claimed in claim 22, further comprising a digital demodulator connected to said digital decimation filter for demodulating said data words by an intermediate frequency signal to produce a demodulated signal, wherein said clock generator circuit includes an additional digital counter connected to said oscillator for generating said intermediate frequency at a sub-multiple of said sampling frequency at a lower frequency than said chopping frequency.

24. The circuit as claimed in claim 23, wherein said intermediate frequency signal is a square wave, and said digital demodulator includes means for selectively complementing said data words in response to said intermediate frequency signal.

25. The circuit as claimed in claim 21, further comprising a complex digital demodulator connected to said digital decimation filter for demodulating said series of data words by an in-phase reference signal at an intermediate frequency and by a quadrature-phase reference signal at said intermediate frequency in order to compute an in-phase detected signal and a quadrature-phase detected signal.

26. The circuit as claimed in claim 25, wherein said in-phase reference signal and said quadrature-phase reference signals are square waves, and said complex digital demodulator includes a first means for selectively complementing said data words in response to said in-phase reference signal to compute said in-phase detected signal, and said complex digital demodulator includes a second means for selectively complementing said data words to compute said quadrature-phase detected signal.

* * * * *